US009228039B2

(12) United States Patent
Wexler et al.

(10) Patent No.: US 9,228,039 B2
(45) Date of Patent: Jan. 5, 2016

(54) CROSSLINKABLE REACTIVE POLYMERS

(71) Applicants:Allan Wexler, Pittsford, NY (US); Grace Ann Bennett, Scottsville, NY (US); Kimberly S. Lindner, Rochester, NY (US)

(72) Inventors: Allan Wexler, Pittsford, NY (US); Grace Ann Bennett, Scottsville, NY (US); Kimberly S. Lindner, Rochester, NY (US)

(73) Assignee: EASTMAN KODAK COMPANY, Rochester, NY (US)

( * ) Notice: Subject to any disclaimer, the term of this patent is extended or adjusted under 35 U.S.C. 154(b) by 83 days.

(21) Appl. No.: 14/084,675

(22) Filed: Nov. 20, 2013

(65) Prior Publication Data

US 2015/0140308 A1    May 21, 2015

(51) Int. Cl.
| | |
|---|---|
| *G03F 7/038* | (2006.01) |
| *C08F 212/14* | (2006.01) |
| *C09D 133/06* | (2006.01) |
| *C09D 133/14* | (2006.01) |
| *C09D 201/02* | (2006.01) |
| *C23C 18/04* | (2006.01) |
| *C23C 18/06* | (2006.01) |
| *G03F 7/039* | (2006.01) |

(52) U.S. Cl.
CPC .......... *C08F 212/14* (2013.01); *C09D 133/068* (2013.01); *C09D 133/14* (2013.01); *C09D 201/025* (2013.01); *C23C 18/04* (2013.01); *C23C 18/06* (2013.01); *G03F 7/038* (2013.01); *G03F 7/039* (2013.01)

(58) Field of Classification Search
CPC .......... G03F 7/004; G03F 7/26; G03F 7/105; G03F 7/038; G03F 7/0382
USPC .................... 430/17, 18, 292, 270.1
See application file for complete search history.

(56) References Cited

U.S. PATENT DOCUMENTS

| | | | |
|---|---|---|---|
| 3,137,668 A | 6/1964 | Kuppers | |
| 4,373,070 A | 2/1983 | Soula | |
| 4,701,351 A | 10/1987 | Jackson | |
| 5,928,840 A | * 7/1999 | Matsuo et al. | 430/324 |
| 6,017,683 A | 1/2000 | Endo et al. | |
| 6,379,863 B1 | 4/2002 | Oohashi et al. | |
| 7,399,579 B2 | 7/2008 | Deng et al. | |
| 7,739,789 B2 | 6/2010 | Kano et al. | |
| 7,934,966 B2 | 5/2011 | Sasaki et al. | |
| 8,012,676 B2 | 9/2011 | Yoshiki et al. | |
| 2007/0246249 A1 | 10/2007 | Kano et al. | |

FOREIGN PATENT DOCUMENTS

| | | | |
|---|---|---|---|
| EP | 0 773 478 A1 | 5/1997 | |
| JP | 2013-028772 | 2/2013 | |
| JP | 2013028772 A | * 2/2013 | |

OTHER PUBLICATIONS

Joanna Aizenberg, et al., "Patterned Colloidal Deposition Controlled by Electrostatic and Capillary Forces," Physical Review Letters, vol. 84, No. 13, Mar. 27, 2000, 2997-3000.
Masamitsu Shirai, et al., "Photo-assisted thermal crosslinking of polymers having imino sulfonate units," Reactive & Functional Polymers 37 (1998) 147-154.
Yuval Ofir, et al., "Polyelectrolyte Negative Resist Patterns as Templates for the electrostatic Assembly of Nanoparticles and Electroless Deposition of Metallic Films," Advanced Materials, 2008, 20, 2561-2566.
Masamitsu Shirai, et al., "Novel Photocrosslinkable Polymers with Pendant Imino Sulfonate Groups," Journal of Polymer Science: Part C: Polymer Letters, vol. 24, 119-134 (1986).
Masamitsu Shirai, et al. "Polysiloxane Formation at the Irradiated surface of Polymers Containing Both Photoacid Generating Units and Epoxy Units," Eur. Polym. J. vol. 33, No. 8, pp. 1255-1262, 1997.
Masamitsu Shirai, et al., "Surface Imaging Using Photoinduced Acid-Catalyzed Formation of Polysiloxanes at Air-Polymer Interface," American Chemical Society, 1994, Chapter 15, pp. 185-200.
Masamitsu Shirai, et al., "Photoinduced Acid-Catalyzed SiO2 Formation at the Polymer Surface by Chemical Vapor Deposition," Macromolecules 1992, 25, 195-200.

\* cited by examiner

*Primary Examiner* — Amanda C Walke
(74) *Attorney, Agent, or Firm* — J. Lanny Tucker

(57) ABSTRACT

Crosslinkable reactive polymers comprise -A- and —B— recurring units, arranged randomly along a backbone. The -A- recurring units comprise pendant aromatic sulfonic acid oxime ester groups that are capable of providing pendant aromatic sulfonic acid groups upon irradiation with radiation having a $\lambda_{max}$ of at least 150 nm and up to and including 450 nm. The -A- recurring units are present in the reactive polymer in an amount of greater than 50 mol % and up to and including 98 mol % based on total reactive polymer recurring units. The —B— recurring units comprise pendant groups that provide crosslinking upon generation of the aromatic sulfonic acid groups in the -A- recurring units. The —B— recurring units are present in an amount of at least 2 mol %, based on total reactive polymer recurring units. These reactive polymers can be used in various pattern-forming methods.

18 Claims, No Drawings

CROSSLINKABLE REACTIVE POLYMERS

RELATED APPLICATIONS

Reference is made to the following related applications:

Copending and commonly assigned U.S. Ser. No. 14/084,693 filed on Nov. 20, 2013 by Irving, Wexler, Bennett, and Lindner and entitled "Forming Conductive Metal Pattern Using Reactive Polymers."

Copending and commonly assigned U.S. Ser. No. 14/084,711 filed on Nov. 20, 2013 by Wexler, Bennett, and Lindner, and entitled "Forming Patterns Using Crosslinkable Reactive Polymers."

Copending and commonly assigned U.S. Ser. No. 14/084,731 filed on Nov. 20, 2013 by Irving and entitled "Electroless Plating Method."

Copending and commonly assigned U.S. Ser. No. 14/084,755 filed on Nov. 20, 2013 by Irving and entitled "Electraless Plating Method Using Bleaching."

Copending and commonly assigned U.S. Ser. No. 14/084,969 filed on Nov. 20, 2013 by Irving and entitled "Electroless Plating Method Using Halide."

Copending and commonly assigned U.S. Ser. No. 14/085,030 filed on Nov. 20, 2013 by Irving and entitled "Electroless Plating Method Using Non-Reducing Agent."

FIELD OF THE INVENTION

This invention relates to novel crosslinkable reactive polymers that upon appropriate irradiation provide reactive aromatic sulfonic acid sites. These crosslinkable reactive polymers can be used to form various patterns using oppositely-charged materials including metal cations, polycationic dyes, or charged inorganic or organic particles.

BACKGROUND OF THE INVENTION

In recent decades accompanying rapid advances in information-oriented society, there have also been rapid technological advances to provide devices and systems for gathering and communicating information. Of these, display devices have been designed for television screens, commercial signage, personal and laptop computers, personal display devices, and phones of all types, to name the most common information sharing devices.

As the increase in the use of such devices has exploded in frequency and necessity by displacing older technologies, there has been a concern that electromagnetic radiation emission from such devices may cause harm to the human body or neighboring devices or instruments over time. To diminish the potential effects from the electromagnetic radiation emission, display devices are designed with various transparent conductive materials that can be used as electromagnetic wave shielding materials.

In display devices where a continuous conductive film is not practical for providing this protection from electromagnetic radiation emission, it has been found that conductive mesh or patterns can be used for this electromagnetic wave shielding purpose for example as described in U.S. Pat. No. 7,934,966 (Sasaki et al.).

Other technologies have been developed to provide microfabrication methods for making metallic, two-dimensional, and three-dimensional structures with conductive metals. Conductive patterns have been provided for these purposes using photolithography and imaging through mask materials as described for example of U.S. Pat. No. 7,399,579 (Deng et al.).

Improvements have been proposed for providing conductive patterns using photosensitive silver salt compositions such as silver halide emulsions as described for example in U.S. Pat. No. 8,012,676 (Yoshiki et al.). Such techniques have a number of disadvantages and efforts continue to make additional improvements.

In addition, as the noted display devices have been developed in recent years, attraction has increased greatly for the use of touch screen technology whereby a light touch on the screen surface with a finger or stylus can create signals to cause changes in screen views or cause reception or sending of information, telecommunications, interaction with the internet, and many other features that are being developed at an ever-increasing pace of innovation. The touch screen technology has been made possible largely by the use of transparent conductive grids on the primary display so that the location of the noted touch on the screen surface can be detected by appropriate electrical circuitry and software.

For a number of years, touch screen displays have been prepared using indium tin oxide (ITO) coatings to create arrays of capacitive patterns or areas used to distinguish multiple point contacts. ITO can be readily patterned using known semiconductor fabrication methods including photolithography and high vacuum processing. However, the use of ITO coatings has a number of disadvantages. Indium is an expensive rare earth metal and is available in limited supply. Moreover, ITO is a ceramic material and is not easily bent or flexed and such coatings require expensive vacuum deposition methods and equipment. In addition, ITO conductivity is relatively low, requiring short line lengths to achieve desired response rates (upon touch). Touch screens used in large displays are broken up into smaller segments in order to reduce the conductive line length to provide acceptable electrical resistance. These smaller segments require additional driving and sensing electronics, further adding to the cost of the devices.

Silver is an ideal conductor having conductivity that is 50 to 100 times greater than that of ITO. Unlike most metal oxides, silver oxide is still reasonably conductive and its use reduces the problem of making reliable electrical connections. Moreover, silver is used in many commercial applications and is available from numerous commercial sources.

In other technologies, transparent polymeric films have been treated with conductive metals such as silver, copper, nickel, and indium by such methods as sputtering, ion plating, ion beam assist, wet coating, as well as the vacuum deposition. However, all of these technologies are expensive, tedious, or extremely complicated so that the relevant industries are spending considerable resources to design improved means for forming conductive patterns for various devices especially touch screen displays.

A similar level of transparency and conductivity for patterns can be achieved by producing very fine lines of about 5-6 µm in width of highly conductive material such as copper or silver metal or conductive polymers. There is a need for way to make thin conductive lines using less expensive materials and plating techniques in order to achieve a substantial improvement in cost, reliability, and availability of conductive patterns for various display devices. The present invention addresses this need as described in considerable detail below.

SUMMARY OF THE INVENTION

The present invention provides a reactive polymer comprising a backbone and at least -A- and —B— recurring units arranged randomly along the backbone, wherein:

the -A- recurring units comprise pendant aromatic sulfonic acid oxime ester groups that are capable of providing pendant aromatic sulfonic acid groups upon irradiation with radiation having a $\lambda_{max}$ of at least 150 nm and up to and including 450 nm, the -A- recurring units being present in the reactive polymer in an amount of greater than 50 mol % and up to and including 98 mol % based on total reactive polymer recurring units, and the —B— recurring units comprise pendant groups that can provide crosslinking upon generation of the aromatic sulfonic acid groups in the -A- recurring units, the —B— recurring units being present in an amount of at least 2 mol %, based on total reactive polymer recurring units.

In particularly useful embodiments, the reactive polymer comprises a backbone and at least -A- and —B— recurring units, arranged randomly along the backbone, wherein:

the -A- recurring units are derived from 1,2,3,4-tetrahydro-1-naphthylideneamino-p-styrenesulfonate, which recurring units are capable of providing pendant aromatic sulfonic acid groups upon irradiation with radiation having a $\lambda_{max}$ of at least 150 nm and up to and including 450 nm, the -A- recurring units being present in the reactive polymer in an amount of greater than 60 mol % and up to and including 95 mol % based on total reactive polymer recurring units, and the —B— recurring units comprise pendant epoxy groups that can provide crosslinking upon generation of the pendant aromatic sulfonic acid groups in the -A- recurring units, the —B— recurring units being present in an amount of at least 5 mol % and up to and including 40 mol %, based on total reactive polymer recurring units, and upon irradiation, the reactive polymer is capable of having an ion exchange capacity of at least 20% based on the theoretical ion exchange capacity of an irradiated homopolymer containing only -A- recurring units.

The present invention also provides a precursor article comprising a substrate having thereon a dry coating of a reactive polymer, the reactive polymer comprising a backbone and at least -A- and —B— recurring units, arranged randomly along the backbone, wherein:

the -A- recurring units comprise pendant aromatic sulfonic acid oxime ester groups that are capable of providing pendant aromatic sulfonic acid groups upon irradiation with radiation having a $\lambda_{max}$ of at least 150 nm and up to and including 450 nm, the -A- recurring units being present in the reactive polymer in an amount of greater than 50 mol % and up to and including 98 mol % based on total reactive polymer recurring units, and the —B— recurring units comprise pendant groups that can provide crosslinking upon generation of the pendant aromatic sulfonic acid groups in the -A- recurring units, the —B— recurring units being present in an amount of at least 2 mol %, based on total reactive polymer recurring units.

Moreover, another embodiment of this invention comprises an intermediate article comprising a substrate having thereon a dry coating comprising:

(1) exposed regions comprising a crosslinked and neutralized polymer comprising a backbone and at least reacted -A- and reacted —B— recurring units, arranged randomly along the backbone, wherein:

the reacted -A- recurring units comprise pendant aromatic sulfonic acid salt groups, the reacted -A- recurring units being present in the reactive polymer in an amount of greater than 50 mol % and up to and including 98 mol % based on total reactive polymer recurring units, and the reacted —B— recurring units provide crosslinking of the reactive polymer, the reacted —B— recurring units being present in an amount of at least 2 mol %, based on total reactive polymer recurring units, and (2) optionally, non-exposed regions comprising a reactive polymer comprising a backbone and at least -A- and —B— recurring units, arranged randomly along the backbone, wherein:

the -A- recurring units comprise pendant aromatic sulfonic acid oxime ester groups, which recurring units are capable of providing pendant aromatic sulfonic acid groups upon irradiation with radiation having a $\lambda_{max}$ of at least 150 nm and up to and including 450 nm, the -A- recurring units being present in the reactive polymer in an amount of greater than 50 mol % and up to and including 98 mol % based on total reactive polymer recurring units, and the —B— recurring units comprise pendant groups that can provide crosslinking upon generation of the pendant aromatic sulfonic acid groups in the -A- recurring units, the reacted —B— recurring units being present in an amount of at least 2 mol %, based on total reactive polymer recurring units.

Moreover, a crosslinked polymeric film of this invention comprises a crosslinked and neutralized polymer comprising a backbone and at least reacted -A- and reacted —B— recurring units, arranged randomly along the backbone, wherein:

the reacted -A- recurring units comprise pendant aromatic sulfonic acid salt groups, the reacted -A- recurring units being present in an amount of greater than 50 mol % and up to and including 98 mol % based on total polymer recurring units, and the reacted —B— recurring units provide crosslinking of the polymer, the reacted —B— recurring units being present in an amount of at least 2 mol %, based on total polymer recurring units.

Further, the present invention also provides an article comprising a substrate, and having thereon a dry polymeric coating comprising exposed and optional non-exposed regions, wherein:

the exposed regions comprise a crosslinked and neutralized polymer comprising a backbone and recurring units comprising neutralized pendant aromatic sulfonic acid groups, and crosslinks derived from different recurring units, the recurring units comprising neutralized pendant aromatic sulfonic acid groups are derived from -A- recurring units and the different recurring units are derived from —B— recurring units, the -A- recurring units comprise pendant aromatic sulfonic acid oxime ester groups, which recurring units are capable of providing neutralized pendant aromatic sulfonic acid groups upon irradiation with radiation having a $\lambda_{max}$ of at least 150 nm and up to and including 450 nm, and the —B— recurring units comprise pendant groups that can provide crosslinking upon generation of the pendant aromatic sulfonic acid groups in the -A- recurring units, and the optional non-exposed regions comprise a reactive polymer comprising -A- recurring units in an amount greater than 50 mol % and up to and including 98 mol % based on total reactive polymer recurring units, and —B— recurring units in an amount of at least 2 mol % based on total reactive polymer recurring units.

Such crosslinked polymeric films can have a dry thickness of at least 10 nm.

The crosslinkable reactive polymers of this invention comprise a high concentration of aromatic sulfonic acid-generating recurring units and a relatively low concentration of recurring units that provide de-blocking and crosslinking in the presence of the generated sulfonic acid groups. This unique combination of recurring units provides, upon UV irradiation, pendant aromatic sulfonic acid groups and sulfonic acid-generated polymer crosslinking. The crosslinked polymer provided by this invention has increased insolubility in water and various organic solvents so that it can be used in various processing solutions such as electroless plating or other pattern-forming solutions. Moreover, the high level of pendant aromatic sulfonic acid groups can be neutralized, for example using an alkali metal cation and the neutralized sulfonate groups in the crosslinked polymer to be used in various ion exchange processes.

The crosslinked polymer provides various advantages from the high number of pendant aromatic sulfonic acid that can prompt crosslinking, or sulfonate groups that can be used in ion exchange processes. Imagewise crosslinking of the reactive polymers can be beneficial in processes to provide surface patterns that can be treated in various ways, for example to create metallic or non-metallic patterns or discriminating patterns of visible dyes or inorganic charged particles.

Another advantage of the reactive polymers of this invention is that they can be formed into relatively thin films that can be exposed and used in various ways. For example, the exposed and crosslinked polymers can be used in various ion exchange methods, including but not limited to exchange with various organic and inorganic ions facilitating electroless plating of metals. In addition, the charges produced in the exposed and crosslinked thin films of the polymers can be used for electrostatic attraction of various organic and inorganic particles including those particles having opposite surface charges.

DETAILED DESCRIPTION OF THE INVENTION

Definitions

As used herein to define various ethylenically unsaturated polymerizable monomer components of the reactive polymers, neutralized polymers, coating solutions, formulations, and coated layers, unless otherwise indicated, the singular forms "a", "an", and "the" are intended to include one or more of the components (that is, including plurality referents).

Each term that is not explicitly defined in the present application is to be understood to have a meaning that is commonly accepted by those skilled in the art. If the construction of a term would render it meaningless or essentially meaningless in its context, the term definition should be taken from a standard dictionary.

The use of numerical values in the various ranges specified herein, unless otherwise expressly indicated otherwise, are considered to be approximations as though the minimum and maximum values within the stated ranges were both preceded by the word "about". In this manner, slight variations above and below the stated ranges can be used to achieve substantially the same results as the values within the ranges. In addition, the disclosure of these ranges is intended as a continuous range including every value between the minimum and maximum values.

Unless otherwise indicated, the term "weight %" refers to the amount of a component or material based on the total solids of a composition, formulation, or layer. Unless otherwise indicated, the percentages can be the same for either a dry layer or pattern, or for the total solids of the formulation or composition.

The term "homopolymer" is meant to refer to polymers that have the same repeating or recurring unit along a polymer backbone. The term "copolymer" refers to polymers composed of two or more different repeating or recurring units that are arranged randomly along the polymer backbone.

For reactive polymers of this invention, the term "arranged randomly" means that blocks of recurring units are not intentionally incorporated into the reactive polymers, but that recurring units are incorporated into the backbone in a random fashion using known polymerization procedures that do not encourage the formation of block copolymers.

Recurring units in reactive polymers described herein are generally derived from the corresponding ethylenically unsaturated polymerizable monomers used in a polymerization process, which ethylenically unsaturated polymerizable monomers have the desired pendant groups. Alternatively, pendant groups can be formed or modified within recurring units after polymerization of ethylenically unsaturated polymerizable monomers having requisite precursor pendant groups.

The term "reactive polymer" is used herein to refer to the copolymers of this invention as described herein that comprise at least, but not exclusively, -A- and —B— recurring units as defined below.

The term "aqueous-based" refers to solutions, baths, or dispersions in which the predominant solvent, or at least 50 weight % of the solvents, is water.

Unless otherwise indicated, the term "mol %" when used in reference to recurring units in reactive polymers, refers to either the nominal (theoretical) amount of a recurring unit based on the amount of ethylenically unsaturated polymerizable monomer used in the polymerization process, or to the actual amount of recurring unit in the resulting reactive polymer.

Reactive Polymers

In general, the reactive polymers of the present invention can be made less soluble (for example, less water-soluble) when provided in an article as a coating on a suitable substrate and irradiated as described below. Thus, the reactive polymers have two essential features: (1) they have labile groups that upon exposure to suitable radiation are de-blocked and provide pendant sulfonic acid groups, and (2) upon such irradiation, they are capable of being crosslinked only when exposed. While the reactive polymers can be supplied as solutions in appropriate solvents, they are best used when applied to a substrate that can be a large or small surface, including the outer surfaces of inorganic or organic particles and then dried.

The reactive polymers are vinyl polymers derived from two or more ethylenically unsaturated polymerizable monomers using suitable polymerization procedures (for example, solution polymerization processes) and conditions, surfactants, and catalysts, all of which would be readily apparent to one skilled in the art from the teaching provided herein.

The useful reactive polymers generally comprise at least some recurring units that comprise pendant aromatic groups attached to the polymer backbone, which pendant aromatic groups comprise a labile oxime ester of sulfonic acid. The term "labile" means that the aromatic sulfonic acid oxime esters can provide pendant aromatic sulfonic acid groups upon de-blocking when the reactive polymer is exposed to radiation having a $\lambda_{max}$ of at least 150 nm and up to and including 450 nm, or more likely exposure to radiation having a $\lambda_{max}$ of at least 150 nm and up to and including 250 nm (sometimes known as "short UV"). Prior to the noted irradiation described below, the labile aromatic sulfonic acid oxime esters are considered "blocked" and are not available for reaction or causing reaction.

The reactive polymers of the present invention also become crosslinked during the noted irradiation and generation of the pendant aromatic sulfonic acid groups. Such crosslinking is provided using pendant crosslinkable groups that are incorporated in —B— recurring units (defined below) randomly distributed along the polymer backbone.

The reactive polymers of this invention can be represented by the following -A-, —B—, and optional —C— recurring units in random order along the polymer backbone.

In particular, the -A- recurring units are derived from any ethylenically unsaturated polymerizable monomer having appropriate pendant aromatic groups that are capable of providing pendant aromatic sulfonic acid groups from aromatic sulfonic acid oxime ester groups having a cleavable —S(=O)$_2$—O—N=C<moiety (for example, a "blocking group"). The sulfur atom of this moiety is typically connected to a carbocyclic aromatic group that is in turn attached to the polymer backbone, and the nitrogen atom of the moiety can have linear or branch substituents.

The —B— recurring units can be derived from any ethylenically unsaturated polymerizable monomer that has pendant groups that can provide sulfonic acid-catalyzed crosslinking in the irradiated polymer. Such pendant groups are well known in the art and some useful examples are described below.

More particularly, the -A-, —B—, and —C— recurring units can be represented as follows:

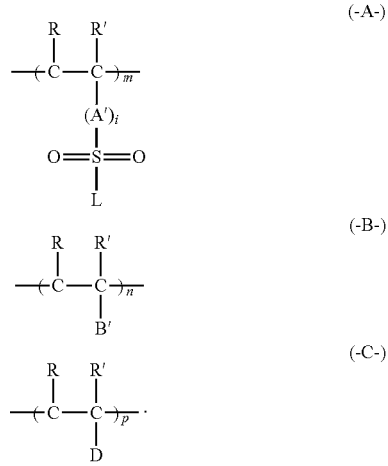

In these formulae, the -A- recurring units comprise blocked (labile) pendant aromatic sulfonic acid oxime ester groups that are capable of providing pendant aromatic sulfonic acid groups upon irradiation from exposing radiation having a $\lambda_{max}$ (maximum wavelength) of at least 150 nm and up to and including 450 nm (or a $\lambda_{max}$ of at least 150 nm and up to and including 250 nm).

Within the -A- recurring units, the moiety identified as A' can represent a single bond (wherein "i" is 0) but A' is most likely a divalent linking group (wherein "i" is 1) such as a substituted or unsubstituted arylene group including but not limited to a substituted or unsubstituted phenylene or naphthalene group. Possible substituents on the arylene group include but are not limited to alkyl groups having 1 to 3 carbon atoms and any other group that would be readily apparent to a skilled worker in the art to not interfere with removal of the L blocking group and such groups can be in any suitable position on the arylene ring. Particularly useful A' groups are substituted or unsubstituted phenylene, and unsubstituted phenylene is most useful.

Moreover, "L" is a blocking group that is readily removed during irradiation of the polymer as noted above such as an oxime ester group containing a —S(=O)$_2$—O—N=C<oxime ester moiety. This moiety is readily cleaved at the O—N bond as this bond is relatively weak in the range of 40 to 60 kcal of energy, to provide pendant aromatic sulfonic acid groups in the polymer. The carbon atom in the noted oxime ester moiety can be attached to the same or different substituted or unsubstituted hydrocarbon group including but not limited to, substituted or unsubstituted alkyl (linear, branched, or cyclic) and substituted or unsubstituted aryl groups, or the carbon atom can be part of a saturated or unsaturated carbocyclic ring (including fused ring systems).

Once the blocking group has been removed from the -A- recurring units during irradiation, the -A- recurring units become "reacted -A- recurring units".

In some embodiments, the reactive polymers comprise greater than 50 mol % -A- recurring units derived from one or more ethylenically unsaturated polymerizable monomers, which recurring units can be represented by the following Structure D':

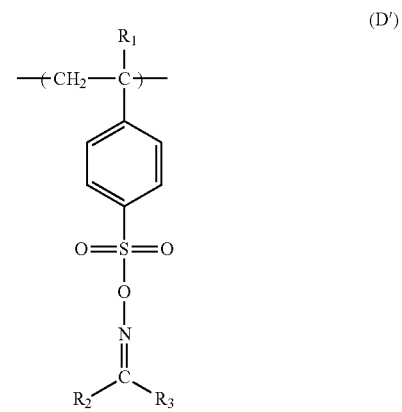

wherein R$_1$ represents hydrogen or an alkyl group having 1 to 3 carbon atoms, and R$_2$ and R$_3$ can be the same or different and represent hydrogen, a substituted or unsubstituted alkyl group (branched or linear and including cycloalkyl groups) having 1 to 10 carbon atoms, a substituted or unsubstituted aryl group having 6 or 10 carbon atoms in the aromatic ring, or a substituted or unsubstituted alkenyl group (branched or linear, and including cycloalkenyl groups) having 2 to 10 carbon atoms.

Alternatively, R$_2$ and R$_3$ together with the carbon atom to which they are attached can form a substituted or unsubstituted non-aromatic carbocyclic ring 5 to 14 carbon atoms in the cyclic ring (including fused rings), which cyclic ring can also have some carbon-carbon unsaturation but not to the extent to give the cyclic ring aromaticity. Such cyclic rings can be substituted, where valences allow, with one or more oxo (=O) groups, or with alkyl groups having 1 to 3 carbon atoms.

After irradiation, the pendant aromatic sulfonic acid groups can be neutralized using suitable cations such as alkali metal cations (for example sodium and potassium) or ammonium cations (for example, ammonium and pyridinium). It is particularly desirable in the practice of the present invention to design the reactive polymers so that upon suitable irradiation as described herein (for example, irradiation at 150 nm to 450 nm), the resulting de-blocked and crosslinked polymers can exhibit an ion exchange capacity of at least 20% (and particularly at least 40%) of the potential (theoretical) ion exchange capacity of a similarly irradiated (at same conditions, exposure source and energy) homopolymer having only the same -A- recurring units. The theoretical ion exchange capacity of a given homopolymer can be calculated as the concentration of acid (mmol) per gram of homopolymer.

Particularly useful -A- recurring units comprise a cyclic oxime ester group and can be derived for example, from 1,2,3,4-tetrahydro-1,-naphthylideneamino-p-styrenesulfonate (sometimes known in the art as "TOSS" ethylenically unsaturated polymerizable monomer).

Representative useful -A- recurring units for reactive polymers are shown as follows (the first structure showing recurring units derived from TOSS), which -A- recurring units may be derivable from the corresponding ethylenically unsaturated polymerizable monomers:

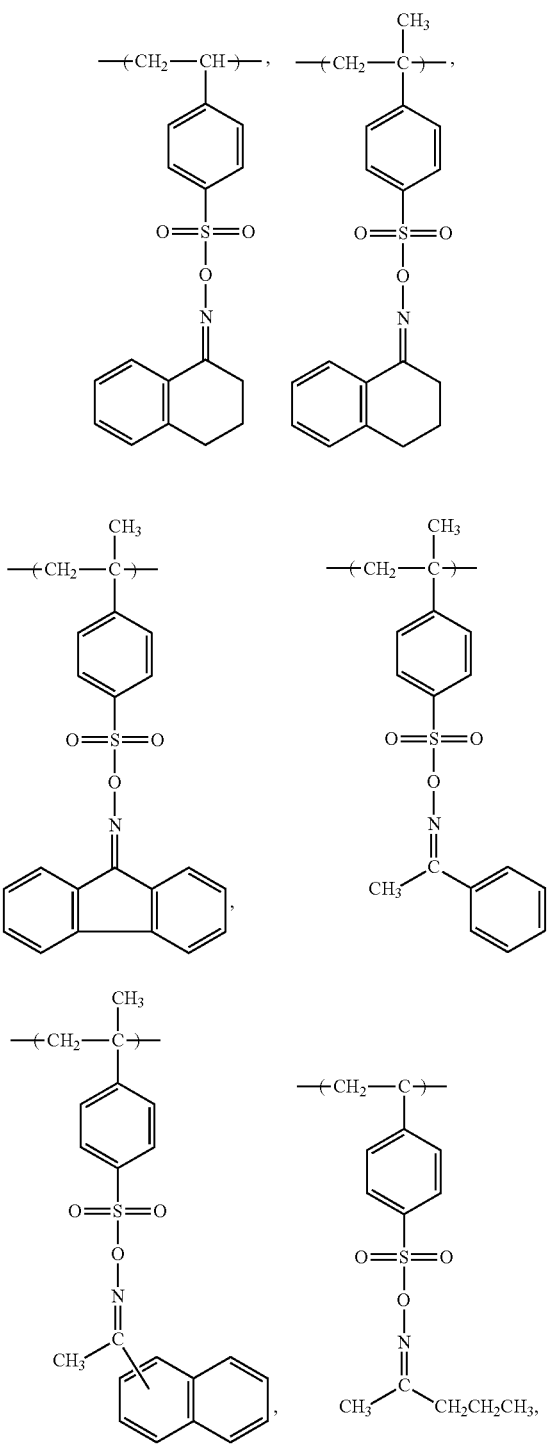

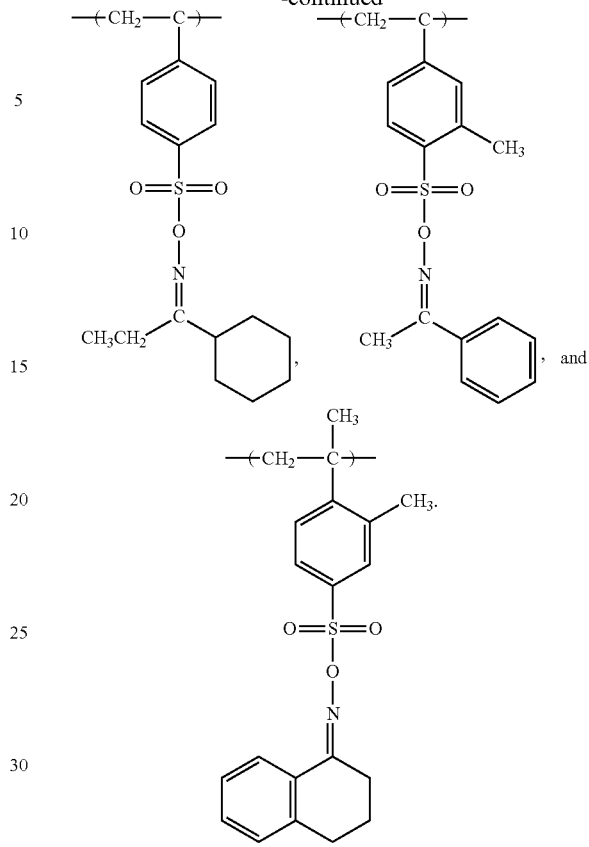

The —B— recurring units can be derived from any suitable ethylenically unsaturated polymerizable monomer, or group of monomers, having the same or different B' group that is capable of providing acid-catalyzed crosslinking when the pendant aromatic sulfonic acid groups are generated in the -A- recurring units during irradiation. For example, the —B— recurring units can comprise pendant B' groups that comprise an epoxy (such as a glycidyl group) or epithiopropyl group. Particularly useful —B— recurring units comprise pendant crosslinkable epoxy groups such as glycidyl groups and can be derived from glycidyl methacrylate or glycidyl acrylate. Other useful ethylenically unsaturated polymerizable monomers that have sulfonic acid-catalyzed crosslinking groups would be readily apparent to one skilled in the art.

Upon irradiation, the —B— recurring units can provide the crosslinking as described above, and are then considered to be "reacted —B— recurring units".

In addition to the -A- and —B— recurring units described above that are essential in the reactive polymers of this invention, the reactive polymers can further comprise one or more additional recurring units that are different from all -A- and —B— recurring units, and herein identified as —C— recurring units. A skilled polymer chemist would understand how to choose such additional recurring units, and for example, they can be derived from one or more ethylenically unsaturated polymerizable monomers selected from the group consisting of alkyl acrylates, alkyl methacrylates, (meth)acrylamides, styrene and styrene derivatives, vinyl ethers, vinyl imides, and other materials that a skilled worker in the art would understand could provide desirable properties to the reactive polymer. Thus, the D groups in the C recurring units can be for example, substituted or unsubstituted alkyl groups, substituted or unsubstituted aryl groups (such as substituted or unsubstituted phenyl groups), alkyl ester groups, aryl ester groups, or ether groups. In many useful C recurring units, the D groups are alkyl carboxyl ester groups wherein the alkyl moiety has 1 to 6 carbon atoms and is linear, branched, or cyclic in form.

In all of the -A-, —B—, and —C— recurring units, R and R' can be the same or different hydrogen, methyl, ethyl, or chloro groups and each type of recurring unit can have the same or different R and R' groups along the polymer backbone. In most embodiments, R and R' are hydrogen or methyl, and R and R' can be the same or different for the various -A-, —B—, and —C— recurring units in a given reactive polymer.

In the -A-, —B—, and —C— recurring unit formulae shown above, "m", "n", and "p" are used to represent the respective molar amounts of recurring units, based on total recurring units, in a given reactive polymer, so that the sum of m, n, and p equal 100 mol % in a given reactive polymer.

In general for the reactive polymers useful in this invention, in the -A- structure shown above, "m" represents the amount of -A- recurring units of at least 50 mol % and up to and including 98 mol % based on total recurring units in the reactive polymer. Typically, "m" is at least 60 mol % and up to and including 98 mol %, or at least 60 mol % and up to and including 90 mol %, based on the total recurring units in the reactive polymer.

In addition, in the —B— structure shown above, "n" represents —B— recurring units in an amount of at least 2 mol %, or more typically at least 5 mol % and up to and including 50 mol %, or even at least 5 mol % and up to and including 40 mol %, based on the total recurring units in the reactive polymer.

Moreover, in the —C— structure shown above, while "p" represents —C— recurring units that can be absent (0 mol %), "p" can be up to and including 50 mol %, or typically at least 3 mol % and up to and including 25 mol %, or at least 5 mol % and up to and including 20 mol %, based on the total recurring units in the reactive polymer.

These mol % amounts of the various recurring units defined herein for the reactive polymers of this invention are meant to refer to the actual molar amounts present in the reactive polymers. It is understood by one skilled in the art that the actual mol % values may differ from those theoretically possible (nominal) based on the amount of ethylenically unsaturated polymerizable monomers that are used in the polymerization procedure. However, under most polymerization conditions that allow high polymer yield and optimal reaction of all monomers, the actual mol % of each monomer is generally within ±15 mol % of the theoretical (nominal) amounts.

Some representative reactive polymer embodiments include but are not limited to, the following copolymers and terpolymers (TOSS is identified above and FLOSS is identified below) wherein the molar ratios are theoretical (nominal) amounts based on the actual molar ratio of recurring units derived from the corresponding monomers used in the polymerization process. The actual molar amounts of recurring units can differ from the theoretical (nominal) amounts of monomers if the polymerization reactions are not carried out to completion.

The "FLOSS" monomer having the following recurring unit structure can be prepared similarly to the TOSS monomer using the synthesis described by Shirai et al. *Reactive & Functional Polymers,* 37 (1998), pp. 147-154:

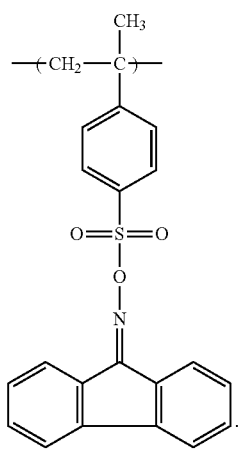

poly(TOSS-co-glycidyl methacrylate) (90:10);
poly(TOSS-co-glycidyl methacrylate) (80:20);
poly(FLOSS-co-glycidyl methacrylate) (80:20);
poly(TOSS-co-glycidyl methacrylate) (60:40);
poly(TOSS-co-glycidyl methacrylate-co-n-butyl acrylate) (80:10:10);
poly(TOSS-co-glycidyl methacrylate-co-n-butyl methacrylate) (80:10:10);
poly(TOSS-co-2-phenoxyethyl acrylate) (80:20);
poly(TOSS-co-glycidyl methacrylate) (80:20);
poly(TOSS-co-glycidyl methacrylate) (50:50);
poly(TOSS-co-glycidyl methacrylate-co-n-butyl acrylate) (70:20:10);
poly(TOSS-co-glycidyl methacrylate-co-2-phenoxyethyl acrylate) (70:20:10); and
poly(FLOSS-co-glycidyl methacrylate-co-2-phenoxyethyl acrylate) (60:35:5).

The reactive polymers generally have a molecular weight ($M_w$) of at least 30,000 and up to and including 300,000 as measured by gel permeation chromatography (GPC) or by size exclusion chromatography (SEC).

Reactive polymers of this invention can be prepared using known free radical solution polymerization techniques using known starting materials, free radical initiators, and reaction conditions in suitable organic solvents such as tetrahydrofuran that can be adapted from known polymer chemistry. Where starting materials (such as ethylenically unsaturated polymerizable monomers) are not available commercially, such starting materials can be synthesized using known procedures.

Preparations of representative reactive polymers are provided below in the Invention Examples.

In general, the prepared reactive polymers are stored in solution in suitable solvents. Depending upon the sensitivity of the reactive polymer to light (such as room light), during and after preparation, the reactive polymers can be kept in the dark or away from light exposure until they are formulated into reactive compositions and used for various purposes. To enhance storage stability, one or more acid scavengers, such as hindered amines, can be added to the reactive polymer solution during or after polymerization. A skilled polymer chemist would know what compounds would be suitable as acid scavengers and how much to use with a particular reactive polymer and desired storage stability.

Reactive Compositions:

The reactive polymers of this invention can be used in reactive compositions in various methods for forming conductive patterns in polymeric layers for example using electroless plating.

Each reactive composition has only one essential component: one or more reactive polymers as described above, each of which provides pendant sulfonic acid groups upon exposure to radiation having $\lambda_{max}$ of at least 150 nm and up to and including 450 nm, as described below, and which reactive polymer can also comprise pendant acid-crosslinkable groups so that a separate crosslinking agent or crosslinking precursor, while optional, is not necessary. While various other optional components can be included as described below, only the reactive polymer is essential for providing the desired pattern in the reactive composition forming the polymeric layer.

One or more reactive polymers of this invention are generally present in the reactive composition (and in the resulting dry polymeric layer) in an amount of at least 50 weight % and up to and including 100 weight %, or typically at least 80 weight % and up to and including 95 weight %, based on the total solids in the reactive composition (or dry polymeric layer weight).

Individual compounds that provide an acid having a pKa of less than 2 (as measured in water) during the noted exposure to radiation are not necessary in most embodiments and can be excluded from the reactive composition. However, in some embodiments, additional imaging sensitivity can be provided by incorporating onium salts that decompose upon irradiation. An onium salt (also known as an onium compound) is a compound that is formed by the attachment of a proton to a mononuclear parent hydride of a Group 15 element (for example nitrogen and phosphorus), a chalcogen of Group 16 (for example sulfur and selenium), or a halogen (such as fluorine, chlorine, and iodine). Particularly useful onium salts include but not limited to, sulfonium salts, phosphonium salts, iodonium salts, and aryldiazonium salts. In such embodiments, the sulfonium salts, phosphonium salts, and iodonium salts are particularly useful, including but not limited to the arylsulfonium salts and aryliodonium salts that can provide an acid having a pKa less than 2, or even less than 0, as measured in water.

In addition, the reactive compositions generally do not include separate crosslinking agents or crosslinking agent precursors because the reactive polymer itself includes sufficient pendant acid-crosslinkable groups. However, if desired for enhanced crosslinking, the reactive composition can include crosslinking agents that will react with pendant sulfonic acid groups or other moieties in the irradiated reactive polymer.

For example, some optional crosslinking agents include but are not limited to, melamine formaldehyde resins, glycoluril formaldehyde resins, polycarboxylic acids and anhydrides, polyamines, epihalohydrins, diepoxides, dialdehydes, diols, carboxylic acid halides, ketenes, aziridines, carbodiimides, isocyanates, and mixtures thereof. Such crosslinking agents can be present in the reactive composition in an amount of at least 1 weight % and up to and including 30 weight %, based on the total solids in the reactive composition.

While not essential, it is sometimes desirable to enhance the sensitivity of some reactive polymers to longer wavelengths (for example, greater than 300 nm) by including one or more photosensitizers in the reactive composition used in this invention. A variety of photosensitizers are known in the art such as aromatic tertiary amines, aromatic tertiary diamines and certain aromatic polycyclic compounds such as substituted or unsubstituted anthracene compounds, as described for example in U.S. Pat. No. 4,069,054 (Smith) and U.S. Pat. No. 7,537,452 (Dede et al.). Particularly useful photosensitizers include unsubstituted anthracene and substituted anthracenes such as 9,10-diethoxyanthracene and 2-t-butyl-9,10-diethoxyanthracene.

One or more photosensitizers can be optionally present in the reactive composition (and dry polymeric layer) in an amount of at least 1 weight % and up to and including 30 weight %, or more likely at least 5 weight % and up to and including 15 weight %, based on the total solids in the reactive composition (or dry polymeric layer weight).

The reactive compositions can optionally include one or more addenda such as film-forming compounds, surfactants, plasticizers, filter dyes, viscosity modifiers, high boiling solvents that are compatible with the reactive polymers (such as phthalated esters including dibutyl phthalate and dioctyl phthalate), and any other optional components that would be readily apparent to one skilled in the art, and such addenda can be present in amounts that would also be readily apparent to one skilled in the art.

The essential reactive polymer and any optional compounds described above are generally dissolved in a suitable organic solvent (or mixture of organic solvents) to form a reactive composition that can be applied to a suitable substrate (described below). Useful organic solvents include but are not limited to, cyclic ketones such as 2-butanone, cyclopentanone and cyclohexanone, substituted benzenes such as chlorobenzene and anisole, ethyl lactate, propylene glycol methyl ether acetate, or γ-butyrolactone. Various mixtures of these organic solvents can be used if desired especially to dilute more toxic organic solvents with less toxic organic solvents such as blends of cyclopentanone with any of ethyl lactate, propylene glycol methyl ether acetate, or γ-butyrolactone.

Articles

The reactive composition described above can be applied to a suitable substrate using any suitable method including but not limited to, spin coating, bead coating, blade coating, curtain coating, or spray coating, from a suitable reservoir to form a polymeric layer. Useful substrates can be chosen for particular use or method as long as the substrate material will not be degraded by the reactive composition or any treatments to which the resulting precursor articles are subjected during the methods of this invention. The reactive composition can be applied multiple times if desired to obtain a thicker coating (reactive layer) of the reactive composition, and dried between each coating or dried only after the last application. Solvent can be removed from the reactive composition using any suitable drying technique.

In general the final dry coating of reactive composition can have an average dry thickness of at least 10 nm and up to and including 10 mm, with a dry thickness of at least 0.1 μm and up to and including 100 μm being more useful. The average dry thickness can be determined by measuring the dry layer thickness in at least 10 different places within a 10 cm by 10 cm square of the dry reactive layer using an electron microscope or other suitable diagnostic device. Thus, in the various articles of this invention, including precursor articles (before any treatments, operations, or steps), intermediate articles (obtained after at least one treatment, operation, or step), or final products (after all desired treatments, operations, or steps), the dry polymeric layer can have the dry thickness as described in this paragraph.

Thus, useful substrates can be composed of glass, quartz, and ceramics as well as a wide variety of flexible materials such as cellulosic papers and polyesters including poly(ethylene terephthalate) and poly(ethylene naphthalate), polycarbonates, polyamides, poly(meth)acrylates, and polyolefins. Useful polymeric substrates can be formed by casting or extrusion methods. Laminates of various substrate materials can also be put together to form a composite substrate. Any of the substrates can be treated to improve adhesion using for example corona discharge, oxygen plasma, ozone or chemical treatments using silane compounds such as aminopropyltriethoxysilane. The substrates can be of any suitable dry thickness including but not limited to at least 10 µm and up to and including 10 mm, depending upon the intended use of the resulting articles.

Particularly useful substrates are composed of poly(ethylene terephthalate) such as biaxially oriented poly(ethylene terephthalate) (PET) films that have broad uses in the electronics market. These PET films, ranging in dry thickness of at least 50 µm and up to and including 200 µm, can also comprise, on at least one side, a polymeric primer layer (also known as a subbing layer, adhesive layer, or binder layer) that can be added prior to or after film stretching. Such polymeric primer layers can comprise poly(acrylonitrile-co-vinylidene chloride-co-acrylic acid), poly(methyl acrylate-co-vinylidene chloride-co-itaconic acid), poly(glycidyl methacrylate-co-butyl acrylate), or various water-dispersible polyesters, water-dispersible polyurethanes, or water-dispersible polyacrylics, as well as sub-micrometer silica particles. The dry thickness of the primer layer can be at least 0.1 µm and up to and including 0.5 µm.

Thus, with the application of the described reactive composition to a suitable substrate, with or without appropriate drying, the present invention also provides a precursor article comprising a substrate and having disposed thereon a polymeric layer comprising a reactive composition that comprises a reactive polymer of the present invention that comprises (1) pendant groups that are capable of providing pendant sulfonic acid groups upon exposure of the reactive polymer to radiation having a $\lambda_{max}$ of at least 150 nm and up to and including 450 nm, and (2) pendant groups that are capable of reacting in the presence of the sulfonic acid groups to provide crosslinking in the reactive polymer.

Uses of Reactive Compositions

The reactive polymer of this invention can be used in reactive compositions to form surface patterns for various purposes as described above. The following discussion provides some details about representative electroless plating methods in which the reactive polymers can be used. In addition, a discussion is provided below relating to other patterning methods. It is to be understood that all of these uses are considered to be examples of how the reactive polymers of the present invention can be used and are not to be considered exclusive of other potential uses.

In a representative electroless plating method, each aqueous-based "processing" solution, dispersion, or bath (for example, solutions containing electroless see metal ions, reducing agent solutions, and solutions for electrolessly plating, as well as rinsing solutions) used at various points can be specifically designed with essential components as well as optional addenda that would be readily apparent to one skilled in the art. For example, one or more of those aqueous-based processing solutions can include such addenda as surfactants, anti-coagulants, anti-corrosion agents, anti-foamants, buffers, pH modifiers, biocides, fungicides, and preservatives. The aqueous-based reducing solutions can also include suitable antioxidants.

Electroless Plating Method:

The reactive polymers of this invention can be used in a method for forming a pattern in a polymeric layer, the method comprising providing a polymeric layer (as in forming the described precursor article), the polymeric layer comprising the reactive composition described above, comprising a reactive polymer of this invention. This polymeric layer can be formed on a suitable substrate, if desired, as described above by suitable application of the reactive composition, after which the reactive composition is typically dried before the resulting article is used in any patterning method.

This polymeric layer in the precursor article, usually in dry form, can be then patternwise exposed to radiation having a $\lambda_{max}$ of at least 150 nm and up to and including 450 nm or to radiation having a $\lambda_{max}$ of at least 150 nm and up to and including 330 nm, to provide a polymeric layer comprising non-exposed regions and exposed regions comprising a polymer comprising pendant aromatic sulfonic acid groups. This exposure can be provided with any suitable exposing source or device that provides the desired radiation including but not limited to, various arc lamps and LED sources. The particular exposing source can be chosen depending upon the absorption characteristics of the reactive composition used. The exposing radiation can be projected through lenses or a lens or mask element that can be in physical contact or in proximity with the outer surface of the polymeric layer. Exposure time can range from a fraction (0.1) of a second and up to and including 10 minutes depending upon the intensity of the radiation source and the reactive composition. Suitable masks can be obtained by known methods including but not limited to photolithographic methods, flexographic methods, or vacuum deposition of a chrome mask onto a suitable substrate such as quartz or high quality optical glass followed by photolithographic patterning.

It is not necessary to heat or bake the polymeric layer in the reactive composition in the precursor article simultaneously with or after the patternwise exposure and generally before contacting the exposed polymeric layer with electroless seed metal ions (described below). Thus, such a heating or baking step or procedure that is used in other methods can be omitted.

The polymeric layer is generally hydrophilic in the exposed regions while still being hydrophobic in the non-exposed regions such that immersion in aqueous-based solutions (described below) will allow the aqueous molecules, ions, or reagent molecules to rapidly diffuse into the exposed regions.

At any time after the patternwise exposing procedure, the reactive composition remaining in the non-exposed regions of the polymeric layer can be removed using an organic solvent in which the polymeric layer comprising the reactive composition is soluble or dispersible. In such procedures at least 50 weight % and typically at least 80 weight % or even at least 90 weight % of the reactive composition in the polymeric layer is removed in the non-exposed regions, based on the total amount of reactive composition originally present in those non-exposed regions.

The removal procedure can be carried out in any suitable manner, including immersion of the intermediate article into a suitable organic solvent or mixture of organic solvents or by spraying the organic solvent or mixture of organic solvents onto the intermediate article surface. Contact with the organic solvent (or mixture thereof) can be carried out for a suitable time and temperature so that reactive composition is desirably removed in the non-exposed regions but little removal (less than 10 weight % of the total material) occurs in the exposed regions containing the de-blocked and crosslinked polymer. For example, the contact time can be at least 10 seconds and up to and including 10 minutes, and the contact temperature can be at room temperature (about 20° C.) and up to and including 50° C.

Organic solvents that can used for this purpose include but are not limited to, ketones such as 2-butanone, cyclopentanone and cyclohexanone, substituted benzenes such as chlorobenzene and anisole, ethyl lactate, propylene glycol methyl ether acetate, or γ-butyrolactone. Various mixtures of these organic solvents can be used if desired especially to dilute more toxic organic solvents with less toxic organic solvents such as blends of cyclopentanone with any of ethyl lactate, propylene glycol methyl ether acetate, or γ-butyrolactone.

In many embodiments, removing the reactive composition in the non-exposed regions of the polymeric layer is carried out immediately after the patternwise exposure and any optional heating procedure.

At this point, an intermediate article has been created in which the exposed regions of the polymeric layer on the substrate comprise de-blocked and crosslinked polymer derived from the reactive polymer of this invention in a reactive composition, and the non-exposed regions of the polymeric layer comprise little or no reactive composition.

Once patternwise exposure has been carried out, the exposed regions of the polymeric layer are contacted with an aqueous-based solution or dispersion of electroless seed metal ions to form a pattern of electroless seed metal ions in the exposed regions of the polymeric layer. There are various ways that this contacting can be carried out. Typically, the entire article is immersed within a dilute aqueous-based solution, bath, or dispersion of the electroless seed metal ions for a sufficient time to coordinate the optimum number of electroless seed metal ions within the de-blocked and crosslinked polymer. For example, this contact with the electroless seed metal ions can be carried out for at least 1 second and up to and including 30 minutes, at room temperature (about 20° C.) or at a higher temperature of up to and including 95° C. The time and temperature for this contact can be optimized for a given reactive composition and electroless seed metal ions that are to be used.

Representative electroless seed metal ions that can be used in these procedures are selected from the group consisting of silver ions, platinum ions, palladium ions, gold ions, tin ions, rhodium ions, iridium ions, nickel ions, and copper ions. Most noble metal ions can serve as electroless seed metal ions in the present invention. These electroless seed metal ions can be provided in the form of a suitable metal salt or metal-ligand complex (that can have an overall positive, negative, or neutral charge). Useful materials of this type include but are not limited to, metal salts and metal-ligand complexes of nitrates, halides, acetates, cyanides, thiocyanates, amines, nitriles, and sulfates. Thus, the electroless seed metal ions can be provided from simple salts or in the form of metal-ligand complexes. The amount of metal salts or metal-ligand complexes present in the aqueous-based solution would be readily apparent to one skilled in the art and can be optimized for a particular reactive composition and exposure procedure. For example, the metal salts or metal-ligand complexes can be present in the aqueous-based solution in an amount sufficient to provide at least 0.00001 molar and up to and including 2 molar of the desired electroless metal ions. In one embodiment, a 0.4 molar silver nitrate solution can be used at room temperature to provide electroless seed silver ions.

The contact with the electroless seed metal ions produces an intermediate article comprising a substrate and having disposed thereon a polymeric layer comprising exposed regions and non-exposed regions, the exposed regions comprising a pattern of electroless seed metal ions within the de-blocked and crosslinked polymer resulting from the irradiation of a reactive polymer of this invention in a reactive composition described above, and the non-exposed regions comprising the reactive composition described herein comprising a reactive polymer of this invention.

After the requisite time to react the electroless seed metal ions within with the crosslinked polymer in the exposed regions, the polymeric layer can be rinsed with distilled or deionized water or another aqueous-based solution for a suitable time and at a suitable temperature, for example usually room temperature or slightly higher.

Optionally at this point, the polymeric layer can be removed in the non-exposed regions as described above, leaving the pattern of electroless seed metal ions in the exposed regions of the polymeric layer.

If this procedure is carried out, an intermediate article is created, which intermediate article comprises a substrate and having disposed thereon exposed regions of a de-blocked and crosslinked polymer derived from a reactive polymer of this invention in a reactive composition described above, and non-exposed regions of the polymeric layer comprising little or no reactive composition, wherein the exposed regions further comprise a pattern of electroless seed metal ions coordinated within the de-blocked and crosslinked polymer.

After forming the pattern of electroless seed metal ions, they can be reduced to provide the corresponding electroless seed metal nuclei in a pattern in the exposed regions of the polymeric layer. This can be done by contacting the polymeric layer (or at least the exposed regions) with a suitable reducing agent for the electroless seed metal ions. For example, the intermediate article comprising the polymeric layer can be immersed within an aqueous-based reducing solution containing one or more reducing agents for a suitable time to cause sufficient metal ion reduction. Alternatively, an aqueous-based reducing solution comprising the reducing agent can be sprayed or rolled uniformly onto the polymeric layer.

Useful reducing agents include but are not limited to, an organic borane, an aldehyde such as formaldehyde, aldehyde sugar, hydroquinone, or sugar (or polysaccharide) such as ascorbic acid, and metal ions such as tin(II). These reducing agents can be used individually or in combination, and the total amount in the aqueous-based reducing solution used for the reducing procedure can be at least 0.01 weight % and up to and including 20 weight % based on the total reducing solution weight. The amount of reducing agent to be used will depend upon the particular electroless seed metal ions and reducing agent to be used, and this can be readily optimized using routine experimentation. The time and temperature for the reduction can also be readily optimized in the same manner. Generally, the reducing temperature is at least room temperature (about 20° C.) and up to and including 99° C. and the reducing time can be for at least 1 second and up to and including 30 minutes.

For example, some embodiments of the present invention can be carried out using an immersion bath comprising 1 reducing solution weight % of an organic borane such as dimethylamine borane (DMAB) at room temperature for up to 3 minutes. Longer or shorter times at higher temperatures are possible if needed.

After this reducing procedure, the polymeric layer, especially the exposed regions, can be again washed using distilled water or deionized water or another aqueous-based solution at a suitable temperature for a suitable time.

At this point, the method has provided yet another intermediate article, comprising a substrate and having disposed thereon a polymeric layer comprising exposed regions and non-exposed regions, the exposed regions comprising a pattern of corresponding electroless seed metal nuclei within the de-blocked and crosslinked polymer resulting from the irradiation of a reactive polymer of this invention in a reactive composition described above, and the non-exposed regions comprising the reactive composition described herein comprising a reactive polymer of this invention.

Optionally at this point, the reactive composition in the non-exposed regions of the polymeric layer can be removed (as described above) after this reducing procedure. This would produce yet another intermediate article that would comprise exposed regions in the polymeric layer comprising a pattern of corresponding electroless seed metal nuclei within the de-blocked and crosslinked polymer resulting from irradiation of a reactive polymer of this invention in a reactive composition as described above, but comprise little or no reactive composition in the non-exposed regions of the polymeric layer.

This intermediate article can be immediately immersed in an aqueous-based electroless metal plating bath or solution, or the treated article can be stored with just the catalytic pattern comprising corresponding electroless seed metal nuclei for use at a later time.

The intermediate article can be contacted with an electroless plating metal that is the same as or different from the corresponding electroless seed metal nuclei. In most embodiments, the electroless plating metal is a different metal from the corresponding electroless seed metal nuclei.

Any metal that will likely electrolessly "plate" on the corresponding electroless seed metal nuclei can be used at this point, but in most embodiments, the electroless plating metal can be for example copper(II), silver(I), gold(IV), palladium (II), platinum(II), nickel(II), chromium(II), and combinations thereof. Copper(II), silver(I), and nickel(II) are particularly useful electroless plating metals.

The one or more electroless plating metals can be present in the aqueous-based electroless plating bath or solution in an amount of at least 0.01 weight % and up to and including 20 weight % based on total solution weight.

Electroless plating can be carried out using known temperature and time conditions, as such conditions are well known in various textbooks and scientific literature. It is also known to include various additives such as metal complexing agents or stabilizing agents in the aqueous-based electroless plating solutions. Variations in time and temperature can be used to change the metal electroless plating thickness or the metal electroless plating deposition rate.

A useful aqueous-based electroless plating solution or bath is an electroless copper(II) plating bath that contains formaldehyde as a reducing agent. Ethylenediaminetetraacetic acid (EDTA) or salts thereof can be present as a copper complexing agent. For example, copper electroless plating can be carried out at room temperature for several seconds and up to several hours depending upon the desired deposition rate and plating rate and plating metal thickness.

Other useful aqueous-based electroless plating solutions or baths comprise silver(I) with EDTA and sodium tartrate, silver(I) with ammonia and glucose, copper(II) with EDTA and dimethylamineborane, copper(II) with citrate and hypophosphite, nickel(II) with lactic acid, acetic acid, and a hypophosphite, and other industry standard aqueous-based electroless baths or solutions such as those described by Mallory et al. in *Electroless Plating: Fundamentals and Applications* 1990.

After the electroless plating procedure, the product article is removed from the aqueous-based electroless plating bath or solution and can again be washed using distilled water or deionized water or another aqueous-based solution to remove any residual electroless plating chemistry. At this point, the polymeric layer and electrolessly plated metal are generally stable and can be used for their intended purpose.

Thus, this method provides a product article comprising a substrate and having disposed thereon a polymeric layer comprising exposed regions and non-exposed regions, the exposed regions comprising a pattern of corresponding electroless seed metal nuclei (for example, in a pattern) that have been electrolessly plated with the same or different metal, in a de-blocked and crosslinked polymer derived from a reactive polymer of this invention in a reactive composition described above, and the non-exposed regions comprising a reactive composition as described herein comprising a reactive polymer of the present invention.

Optionally at this point, the reactive composition can be removed from the non-exposed regions of the polymeric layer after electrolessly plating the corresponding electroless seed metal nuclei so that the resulting product article comprises a pattern of electrolessly plated metal in the exposed regions of the polymeric layer containing the de-blocked and crosslinked polymer derived from a reactive polymer of this invention, but it comprises little or no reactive composition in the non-exposed regions of the polymeric layer.

To change the surface of the electroless plated metal for visual or durability reasons, it is possible that a variety of post-treatments can be employed including surface plating of still at least another (third or more) metal such as nickel or silver on the electrolessly plated metal (this procedure is sometimes known as "capping"), or the creation of a metal oxide, metal sulfide, or a metal selenide layer that is adequate to change the surface color and scattering properties without reducing the conductivity of the electrolessly plated (second) metal. Depending upon the metals used in the various capping procedures of the method, it may be desirable to treat the electrolessly plated metal with a metal catalyst to facilitate deposition of additional metals. Depending upon the metals used in the various capping procedures of the method, it may be desirable to treat the electrolessly plated metal with a seed metal catalyst in an aqueous-based seed metal catalyst solution to facilitate deposition of additional metals.

As one skilled in the art should appreciate, the individual treatments or steps described above for this method can be carried out two or more times before proceeding to the next procedure or step. For example, the treatment with the aqueous-based solution containing electroless seed metal ions can be carried out two or more times in sequence, for example, with a rinsing step between sequential treatments. The electroless seed metal ions can be the same or different for the sequential treatments and the treatment conditions can be the same or different.

In addition, multiple treatments with an aqueous-based reducing solution or aqueous-based seed metal catalyst solution can be carried out in sequence, using the same or different conditions.

In addition, multiple treatments with an aqueous-based reducing solution or aqueous-based seed metal catalyst solution can be carried out in sequence, using the same or different conditions. Sequential washing or rinsing steps can also be carried out where appropriate.

Further, the electroless plating procedures can be carried out multiple times, in sequence, using the same or different electroless plating metal and the same or different electroless plating conditions and times.

It is also possible to use the product article provided by this method that comprises the noted pattern of an electrolessly plated metal, to incorporate a second or more patterns in the non-exposed regions. This can be accomplished by subjecting this article to the same sequence of procedures or steps using the same or different reagents and aqueous-based solutions to provide at least a second pattern in what would be considered second exposed regions since the electrolessly plated metal would be in what is considered the first exposed regions. The second exposed regions can comprise all of the original non-exposed regions, or they can comprise only some of the non-exposed regions. For example, to create a second pattern in the article having the electrolessly plated metal, the article can be treated or processed as follows, using conditions and aqueous-based solutions similar to or the same as those described above:

a) patternwise exposing the previously non-exposed regions to form second exposed regions in the polymeric layer, b) optionally heating the polymeric layer, c) contacting at least the second exposed regions with an aqueous-based solution containing electroless seed metal ions, and optionally rinsing, d) reducing the coordinated electroless seed metal ions with an aqueous-based reducing solution, and optionally rinsing, and e) electrolessly plating the same or different metal in the second exposed regions.

Other Electroless Plating Methods:

The reactive polymers of this invention can also be used in the various methods described in the copending and commonly assigned U.S. Ser. No. 14/084,732; U.S. Ser. No. 14/084,755; U.S. Ser. No. 14/084,969; and U.S. Ser. No. 14/085,030; all of which are identified above, and incorporated herein by reference for the details about these electroless plating methods.

Other Patterning Methods:

The reactive polymers of this invention can also be used to provide detectable patterns using cationic dyes or charged inorganic particles, or both. For example, the details of such patterning methods are provided in copending and commonly assigned U.S. Ser. No. 14/084,711 filed on Nov. 20, 2013, identified above, and incorporated herein by reference in its entirety.

One such method comprises:

providing a polymeric layer comprising a reactive composition comprising a reactive polymer of the present invention comprising the -A- and —B— recurring units and molar amounts described above, and patternwise exposing the polymeric layer to radiation having a $\lambda_{max}$ of at least 150 nm and up to and including 450 nm to provide pendant aromatic sulfonic acid groups and to provide crosslinking of the pendant sulfuric acid-crosslinkable groups in the exposed regions of the polymer coating.

Such a method can further comprise:

neutralizing the pendant aromatic sulfonic acid groups in the exposed regions of the polymeric layer, contacting both the exposed and non-exposed regions of the polymeric layer with a polycationic colorant that ionically binds to at least some of the pendant neutralized sulfonic acid groups in the exposed regions of the polymeric layer, and that adsorbs to the polymeric layer in the non-exposed regions, washing the polymeric layer with an aqueous solution to remove only non-bound polycationic colorant from the exposed regions of the polymeric layer and non-adsorbed polycationic colorant from the non-exposed regions of the polymeric layer.

Moreover, the method can further comprise after this washing, contacting the polymeric layer with negatively-charged colloidal particles that adhere to the non-exposed regions of the polymeric layer having adsorbed polycationic colorant, and again washing the polymeric layer to remove non-adhering negatively-charged colloidal particles from the exposed regions of the polymeric layer.

Alternatively, the method can comprise after the first washing:

contacting the polymeric layer with positively-charged colloidal particles that adhere to the exposed regions of the polymeric layer, and again washing the polymeric layer to remove non-adhering positively-charged colloidal particles from the non-exposed regions of the polymeric layer.

This method can be used with the precursor article described above, and can then be used to provide an intermediate article comprising a substrate and having disposed thereon a dry polymeric layer comprising exposed regions and non-exposed regions, the exposed regions of the polymeric layer comprising a de-blocked and crosslinked copolymer comprising reacted -A- recurring units and reacted —B— recurring units, and neutralized pendant aromatic sulfonic acid groups in the reacted -A- recurring units to which a polycationic colorant is ionically bound, which de-blocked and crosslinked copolymer is derived from the reactive polymer of this invention, and the non-exposed regions of the dry polymeric layer comprising a non-crosslinked reactive polymer of this invention comprising the -A- and —B— recurring units and molar amounts described above, and the non-exposed regions further comprising adsorbed polycationic colorant.

The noted method using the reactive polymers of this invention thus be used to provide an article comprising a substrate and having disposed thereon a polymeric layer comprising exposed and non-exposed regions, the exposed regions of the polymeric layer comprising a de-blocked and crosslinked copolymer comprising neutralized pendant aromatic sulfonic acid groups to which a polycationic colorant is ionically bound, which de-blocked and crosslinked copolymer is derived from a reactive polymer of this invention comprising -A- and —B— recurring units, and the non-exposed regions of the polymeric layer comprising a reactive polymer of this invention comprising -A- and —B— recurring units in molar amounts as described above, and the non-exposed regions of the polymeric layer further comprising adsorbed polycationic colorant and negatively-charged colloidal particles.

In addition, the reactive polymer of this invention can be used to provide a different article comprising a substrate and having disposed thereon a polymeric layer comprising exposed and non-exposed regions, the exposed regions of the polymeric layer comprising a de-blocked and crosslinked copolymer comprising neutralized pendant aromatic sulfonic acid groups and absorbed polycationic colorant, and the exposed regions further comprising positively-charged colloidal particles adhered to the surface of the polymeric layer, which de-blocked and crosslinked copolymer is derived from a reactive polymer of this invention comprising -A- and —B— recurring units, and the non-exposed regions of the polymeric layer comprising the reactive polymer of this invention comprising -A- and —B— recurring units and molar amounts described above, and the non-exposed regions of the polymeric layer further comprising adsorbed polycationic colorant.

The present invention provides at least the following embodiments and combinations thereof, but other combinations of features are considered to be within the present invention as a skilled artisan would appreciate from the teaching of this disclosure:

1. A reactive polymer comprising a backbone and at least -A- and —B— recurring units, arranged randomly along the backbone,
wherein:
the -A- recurring units comprise pendant aromatic sulfonic acid oxime ester groups that are capable of providing pendant aromatic sulfonic acid groups upon irradiation with radiation having a $\lambda_{max}$ of at least 150 nm and up to and including 450 nm, the -A- recurring units being present in the reactive polymer in an amount of greater than 50 mol % and up to and including 98 mol % based on total reactive polymer recurring units, and
the —B— recurring units comprise pendant groups that can provide crosslinking upon generation of the pendant aromatic sulfonic acid groups in the -A- recurring units, the —B— recurring units being present in an amount of at least 2 mol %, based on total reactive polymer recurring units.

2. The reactive polymer of embodiment 1, wherein the -A- recurring units are present in an amount of at least 60 mol % and up to and including 95 mol % based on total reactive polymer recurring units.

3. The reactive polymer of embodiment 1 or 2, wherein the —B— recurring units are present in an amount of at least 5 mol % and up to and including 40 mol % based on total reactive polymer recurring units.

4. The reactive polymer of any of embodiments 1 to 3, wherein the —B— recurring units comprise pendant crosslinking epoxy groups.

5. A reactive polymer comprising a backbone and at least -A- and —B— recurring units, arranged randomly along the backbone,
wherein:
the -A- recurring units are derived from 1,2,3,4-tetrahydro-1-naphthylideneamino-p-styrenesulfonate, which recurring units are capable of providing pendant aromatic sulfonic acid groups upon irradiation with radiation having a $\lambda_{max}$ of at least 150 nm and up to and including 450 nm, the -A- recurring units being present in the reactive polymer in an amount of greater than 60 mol % and up to and including 95 mol % based on total reactive polymer recurring units, and
the —B— recurring units comprise pendant epoxy groups that can provide crosslinking upon generation of the pendant aromatic sulfonic acid groups in the -A- recurring units, the —B— recurring units being present in an amount of at least 5 mol % and up to and including 40 mol %, based on total reactive polymer recurring units, and
upon irradiation, the reactive polymer is capable of having an ion exchange capacity of at least 20% based on the theoretical ion exchange capacity of an irradiated homopolymer having only the same -A- recurring units.

6. The reactive polymer of any of embodiments 1 to 5, further comprising one or more additional recurring units that are different from all -A- and —B— recurring units.

7. The reactive polymer of embodiment 6, wherein the one or more additional recurring units are derived from one or more ethylenically unsaturated polymerizable monomers selected from the group consisting of alkyl acrylates, alkyl methacrylates, (meth)acrylamides, vinyl esters, (meth)acrylonitrile, maleic anhydrides, maleic imides, and styrene and styrene derivatives.

8. The reactive polymer of embodiment 6 or 7, wherein the one or more additional recurring units are present in an amount of at least 3 mol % and up to and including 25 mol % based on the total reactive polymer recurring units.

9. The reactive polymer of any of embodiments 1 to 8, having a molecular weight of at least 30,000 and up to and including 300,000.

10. The reactive polymer of any of embodiments 1 to 9, wherein upon irradiation, the reactive polymer is capable of having an ion exchange capacity of at least 20% based on the theoretical ion exchange capacity of an irradiated homopolymer having only the same -A- recurring units.

11. The reactive polymer of any of embodiments 6 to 10, further comprising at least 3 mol % and up to and including 20 mol %, based on total reactive polymer recurring units, of one or more additional recurring units that are different from all -A- and —B— recurring units.

12. A precursor article comprising a substrate having thereon a dry coating of a reactive polymer of any of embodiments 1 to 11.

13. The article of embodiment 12, wherein the dry coating of the reactive polymer has an average dry thickness of at least 10 nm.

14. An intermediate article comprising a substrate having thereon a dry coating comprising:
(1) exposed regions comprising a de-blocked, crosslinked, and neutralized polymer comprising a backbone and at least reacted -A- and reacted —B— recurring units, arranged randomly along the backbone, wherein:
the reacted -A- recurring units comprise pendant aromatic sulfonic acid salt groups, the reacted -A- recurring units being present in the reactive polymer in an amount of greater than 50 mol % and up to and including 98 mol % based on total reactive polymer recurring units, and
the reacted —B— recurring units provide crosslinking of the reactive polymer, the reacted —B— recurring units being present in an amount of at least 2 mol %, based on total reactive polymer recurring units, and
(2) optionally, non-exposed regions comprising a reactive polymer of any of embodiments 1 to 11.

15. The article of embodiment 14, wherein the -A- recurring units of the neutralized polymer comprise pendant aromatic sulfonic acid alkali metal salt groups.

16. A crosslinked polymeric film comprising a de-blocked, crosslinked, and neutralized polymer comprising a backbone and at least reacted -A- and reacted —B— recurring units, arranged randomly along the backbone, wherein:
the reacted -A- recurring units comprise pendant aromatic sulfonic acid salt groups, the reacted -A- recurring units being present in an amount of greater than 50 mol % and up to and including 98 mol % based on total polymer recurring units, and
the reacted —B— recurring units provide crosslinking of the polymer, the —B— recurring units being present in an amount of at least 2 mol %, based on total polymer recurring units.

17. The crosslinked polymeric film of embodiment 16, having a dry thickness of at least 10 nm.

18. An article comprising a substrate, and having thereon a dry polymeric coating comprising exposed and optional non-exposed regions, wherein:
the exposed regions comprise a de-blocked, crosslinked, and neutralized polymer comprising a backbone and recurring units comprising neutralized pendant aromatic sulfonic acid groups, and crosslinks derived from different recurring units, the recurring units comprising neutralized pendant aromatic sulfonic acid groups are derived from -A- recurring units and the different recurring units are derived from —B— recurring units, the -A- recurring units comprise pendant aromatic sulfonic acid oxime ester groups, which recurring units are capable of providing neutralized pendant aromatic sulfonic acid groups upon irradiation with radiation having a $\lambda_{max}$ of at least 150 nm and up to and including 450 nm, and the —B— recurring units comprise pendant groups that can provide crosslinking upon generation of the pendant aromatic sulfonic acid groups in the -A- recurring units, and the optional non-exposed regions comprise a reactive polymer of any of embodiments 1 to 11.

For some of the examples described below, the TOSS monomer was prepared using the following synthetic preparation:

Embodiments of reactive polymers of the present invention and non-inventive Comparative polymers outside the present invention were prepared using the following general synthetic scheme showing a copolymer 4 derived from the TOSS monomer and glycidyl methacrylate (Gm), which general synthetic reaction scheme is not to be considered limiting for the present invention. The reactants 1 and 2 and TOSS monomer 3 were prepared as described below.

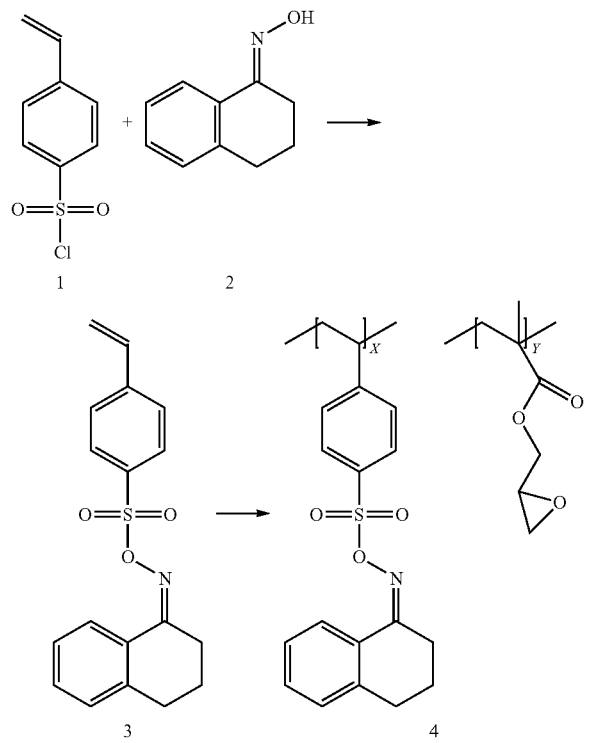

p-Styrenesulfonyl chloride 1 was prepared from sodium p-styrenesulfonate and thionyl chloride according to the method reported by Kamogawa et al. [*Bull. Chem. Soc. Jpn.*, 56, 762-765 (1983)].

α-Tetralone oxime 2 was prepared from α-tetralone according to the method reported by Zhao et al. [*Organic Lett.*, 10, 505-507 (2008)] with the following modifications:

A single neck 1 liter round bottom flask with magnetic stirring was charged with α-tetralone oxime (33.00 g, 0.226 mol), hydroxylamine hydrochloride (24.0 g, 0.345 mol), sodium acetate (31.67 g, 0.386 mol), 200 ml of water, and 200 ml of methanol and heated under nitrogen at reflux temperature for 4 hours. The mixture was allowed to cool and then placed in a freezer overnight to crystallize the reaction product. The resulting white crystals were collected, rinsed with methanol, and dried to yield 28.54 g (78%) of the desired oxime 2.

1,2,3,4-Tetrahydro-1,-naphthylideneamino p-styrenesulfonate 3 was prepared according to the method reported by M. Shirai et al. [*Macromoledules,* 25, 195-200 (1992)] with the following modifications (the prepared reaction solution and resulting TOSS monomer 3 were protected from room light as much as possible during the reaction and workup):

A single neck 250 ml amber round bottom flask with magnetic stirring was charged with α-tetralone oxime (7.95 g, 0.049 mol), pyridine (15.0 g, 0.380 mol) and cooled in an ice bath to 0° C. p-Styrenesulfonyl chloride (10.0 g, 0.049 mol) was added dropwise while keeping the reaction solution temperature below 5° C. The reaction solution was allowed to warm to room temperature and the reaction was monitored by thin layer chromatography (TLC, silica gel with 100% methylene chloride eluting solvent). When the desired reaction was complete (about 4 hours), methylene chloride (100 ml) and a 10% aqueous hydrochloric acid solution (100 ml) were added to the reaction solution and the desired product was extracted twice using 100 ml of methylene chloride. The extracts were combined and washed with water (twice with 100 ml), dried over magnesium sulfate, and evaporated to dryness. The residue was purified by gravity column chromatography (GCC) (silica gel with 100% methylene chloride eluting solvent) to yield 11.66 g (72%) of a white solid TOSS monomer 3. Due to the instability of the TOSS monomer as a solid, it was stored as a solution in tetrahydrofuran (THF, 25% solids) in the refrigerator for up to 3 days before it was used to prepare copolymers as described below.

INVENTION EXAMPLES 1-11 AND COMPARATIVE EXAMPLE 1-4

Preparation of Reactive Polymer Embodiments

During preparation and use, all of the reactive polymers were protected from room light as much as possible. For the reactive polymer of Invention Example 1, having an approximate composition of 80:20 mol ratio of TOSS monomer 3 1,2,3,4-tetrahydro-1,-naphthylideneamino p-styrenesulfonate (3.00 g, 0.0092 mol) and glycidyl methacrylate (Gm, 0.33 g, 0.0023 mol), the two ethylenically unsaturated polymerizable monomers were dissolved in THF (10.0 g, 25% solids) in a 100 ml amber round bottom and purged with nitrogen for about 30 minutes. A polymerization initiator, 2,2'-azobisisobutyronitrile, was added (0.06 g, 0.0003 mol, 3 mol % of combined monomers) and the flask was sealed with a secured septum and set in a preheated oil bath at 65° C. for 10 hours (polymerizations were run between 5 and 10 hours with 8 hours being the optimum time). The reaction solution was cooled and precipitated into ethyl acetate (300 ml) and the resulting solid copolymer was collected by filtration and dried. The solid copolymer was redissolved in THF at 25% solids and precipitated into methanol (300 ml). The solid copolymer was collected by filtration and dried to yield 2.46 g (74%) that were dissolved in THF at 15% solids and 1,2,2,6,6-pentamethylpiperidine (12.3 µl, 1 mol % based on the -A- recurring units in the reactive polymer) was added to provide storage stability. The resulting solution was stored in the refrigerator for up to 4 months before use. The resulting polymer was characterized as follows to determine that the desired copolymer was obtained.

Characterization Data by NMR:

Approximately 150 mg of the polymer was dissolved in 3 ml of $CD_2Cl_2$. TMS was added as a chemical shift reference and $Cr(acac)_3$ was added as a relaxation agent. A $^{13}C$ NMR spectrum was obtained at 125 MHz under quantitative conditions. The actual mol % of each type of recurring unit in the desired polymer was determined from integral averages from several resonances of each recurring unit.

Characterization Data by SEC:

The sample of polymer was examined using size-exclusion chromatography (SEC) at 35° C. in N,N-dimethylformamide (DMF) containing 0.01 molar lithium nitrate. The column set consisted of three 8 mm×300 mm GRAM Linear M columns from Polymer Standards Services, calibrated with narrow-molecular-weight distribution poly(methyl methacrylate) (PMMA) standards. This system has multiple detectors that measure differential refractive index, UV-Visible absorption, and viscosity of the eluent. The results were plotted as the normalized differential logarithmic molecular weight distribution where the ordinate "$W_n$ (log M)" is the weight fraction of polymer per log M increment. The number-average ($M_n$), weight-average ($M_w$), z-average ($M_z$) molecular weights and intrinsic viscosity in units of dl/g in DMF at 35.0° C. (if applicable) are determined. The long-term 3σ coefficient of variation for $M_w$ of a broad PMMA standard was ±5%. Only $M_w$ values are shown below in TABLE I.

The reactive polymers of Invention Examples 2-10 and non-inventive polymers of Comparative Example 1-5 were prepared in the same manner with varying nominal molar ratios of the ethylenically unsaturated polymerizable monomers as shown below in TABLE I. These polymers were characterized for actual recurring unit mol % and molecular weight in the same manner.

The following TABLE I has a summary the various polymers inside and outside of the present invention that were prepared using the general synthetic method described for Invention Example 1. The —C— Monomer and —C— Recurring Unit refer to the specific additional ethylenically unsaturated polymerizable monomers used to prepare the reactive polymers as identified in TABLE I. The TOSS recurring unit is a representative example of the "-A-" recurring units and Gm is a representative example of the "—B—" recurring units as noted above for the definition of the reactive polymers of the present invention.

TABLE I

| Example | TOSS Monomer (nominal mol %) | TOSS Recurring Unit (actual mol %)[a] | Gm Monomer (nominal mol %) | Gm Recurring Unit[b] (actual mol %)[a] | —C— Monomer (nominal mol %) | —C— Recurring Unit (actual mol %)[a] | Polymer $M_w$ |
|---|---|---|---|---|---|---|---|
| Invention 1 | 80 | 86 | 20 | 14 | 0 | 0 | 39,900 |
| Invention 2 | 60 | 69 | 40 | 31 | 0 | 0 | 47,300 |
| Invention 3 | 80 | 85 | 20 | 15 | 0 | 0 | 96,300 |
| Comparative 1 | 100 | 100 | 0 | 0 | 0 | 0 | 108,000 |
| Invention 4 | 80 | 84 | 20 | 16 | 0 | 0 | 126,000 |
| Invention 5 | 80 | 83 | 20 | 17 | 0 | 0 | 82,900 |
| Comparative 2 | 20 | 24 | 80 | 76 | 0 | 0 | 45,600 |
| Invention 6 | 50 | 55 | 50 | 45 | 0 | 0 | 49,700 |
| Invention 7 | 80 | 87 | 10 | 9.4 | 10 | n-butyl acrylate 3.5 | 292,000 |
| Invention 8 | 80 | 83 | 10 | 7.7 | 10 | n-butyl methacrylate 8.8 | 277,000 |
| Comparative 3 | 80 | 89 | 0 | 0 | 20 | 2-phenoxyethyl acrylate 11 | 64,700 |
| Comparative 4 | 80 | 90.8 | 0 | 0 | 20 | n-butyl acrylate 9.2 | 73,400 |
| Invention 9 | 80 | 85 | 10 | 11 | 10 | n-butyl acrylate 3.8 | 223,000 |
| Invention 10 | 70 | 77 | 20 | 19 | 10 | n-butyl acrylate 4 | 109,000 |
| Invention 11 | 70 | 79 | 20 | 16 | 10 | 2-phenoxyethyl acrylate 4.5 | 101,000 |
| Invention 12 | 90 | 90 | 10 | 10 | 0 | 0 | 278,000 |

[a]mol % determined by NMR
[b]Derived from glycidyl methacrylate

Some of the reactive polymers described above were used in various patterning methods in the following manner.

USE EXAMPLES

Precursor articles comprising a reactive polymer composition described herein, or a Control polymer composition, disposed on a substrate were prepared and evaluated using the following procedures.

Preparation of Quartz Plates with "Piranha" Solution:

Reagent grade sulfuric acid (350 ml) was poured into a clean dry 600 ml Pyrex beaker followed by the slow addition of 150 ml of a 30% hydrogen peroxide ($H_2O_2$) solution. Glass plates were placed into a Teflon holder and lowered into the resulting "Piranha" solution until they were completely submerged. The glass plates were left in the "piranha" solution for 1 hour, and they were then transferred to a Pyrex beaker containing 500 ml of Milli-Q water where the glass plates and holder were dunked up and down for 1 minute. The Pyrex beaker containing the Milli-Q water was emptied and refilled and this washing process was repeated twice. The washed glass plates were then stored in water until further use as substrates, at which time they were dried in an oven at 95° C.

Preparation of Adhesion Promoting Coating:

A 1% solution of aminopropyltriethoxysilane (APTES) in Milli-Q water was prepared (10 g of APTES in 990 g of Milli-Q water) and stirred for 20 minutes. A portion (500 ml) of this solution was poured into each of two 600 ml Nalgene beakers. Each of three of the glass plates described above was placed in each beaker, leaning them on the sides of the beaker without overlapping them, and left for 30 minutes. The glass plates were then removed, rinsed 3 times with Milli-Q water, and baked for 1 hour at 95° C. Each glass plate was then rinsed for one minute each in the following solvent sequence: acetone, Milli-Q water, acetone, tetrahydrofuran, and lastly acetone. The treated glass plates were then ready for use or they could be stored for 2 hours in Milli-Q water.

Preparation of Reactive Polymer Solutions:

Solutions (1 weight %) of the reactive polymers of this invention and Comparative polymers were prepared by dissolving the particular polymer initially in tetrahydrofuran (THF) to give a 15 weight % solution and then diluting with THF to 1 weight %. The data shown in TABLE III below was generated using reactive polymer solutions prepared in the same manner except that the reactive polymers or Comparative polymers were present at 6 weight %.

Spin coating of Reactive Polymer Solutions:

A spin-coater was set to coat at 2500 RPM for 30 seconds. An APTES-coated glass plate described above was removed from water, dried using nitrogen. A coating solution (0.5 ml) of each reactive polymer (or Comparative polymer) was spin coated to provide a dried polymer coating on the glass plate substrate to form precursor articles.

Determination of Ion Exchange Capacity:

This parameter was determined for many of the reactive polymers of this invention as well as some of the Comparative polymers, as follows:

A 0.0036 molar sodium bicarbonate solution was prepared and thoroughly mixed to be used as a titration medium. A 0.02 normal solution of hydrochloric acid was also prepared for use as a titrant. A polymer-coated quartz slide (a precursor article as described above) was placed in a glass Petri dish with the polymer-coated side facing upward and 25 ml of the titration medium was then added to the Petri dish. A flat surface combination pH electrode was used, and titration was carried out using the titrant at 30 seconds between each titrant addition to allow equilibration. The titration medium was stirred for 2 minutes prior to initiating titration with the hydrochloric acid titrant, and the equivalence point for each titration was evaluated using a conventional Gran's plot technique. Replicate experiments were carried out to obtain the average mmol/g of polymer results shown in the last column.

The results of these evaluations are provided in TABLE III below for the several Invention reactive polymers and Comparative polymers.

Exposure of Precursor Articles:

The polymer coating in each precursor article was uniformly (not patternwise) exposed using an Oriel 6292 200 Watt Mercury(Xenon) Ozone Free lamp (Newport Corporation). Between the lamp and the precursor article, at 5 cm distance from the lamp, was interposed a 400 nm OD 2 shortpass 50 mm diameter filter (Edmund Optics). Unless otherwise noted, each exposure was for sixty seconds with the precursor article (and polymer coating) arranged at a 28.5 cm distance from the lamp. This exposure provided a de-blocked and crosslinked polymer having pendant aromatic sulfonic acid groups in the precursor articles. The exposed Comparative polymers were either not crosslinked or insufficiently crosslinked.

Neutralization of Exposed Polymer:

Samples of exposed articles containing an exposed polymeric layer were placed in a 0.5% sodium bicarbonate bath for forty seconds to neutralize pendant sulfonic acid groups that were present in the polymeric layer.

Dye Treatment of Exposed and Neutralized Polymer:

Following neutralization, samples of exposed articles were dipped in a 0.1 weight % aqueous dye solution (dyes described below) for ten minutes, rinsed under a stream of deionized water, and then dried with nitrogen. Where dye solubility did not reach 0.1 weight % in water, the immersion time in the dye solution was extended to four hours. The result was articles having dye absorbed to part or all neutralized polymer in the polymeric layer.

Particle Deposition on Dye Treated Articles:

A 1 weight % aqueous suspension of the surface-charged silica particles (described below in TABLES V and VI) at pH 7 was placed on each of the imagewise exposed and neutralized polymer surfaces for ten minutes to allow the silica particles to settle onto the polymer surfaces. While still wet, each article was affixed to a holder such that the polymer surface was at a 45 degree angle to vertical and immediately rinsed using a vertical deionized water stream from a pressure vessel at a pressure of at least 5 psi.

Negative Silica Particles:

Angstrom Sphere Silica Microspheres were purchased from Fiber Optic Center Inc. New Bedford, Mass. A 1% aqueous dispersion of the nominal 1 μm silica particle was prepared by weighing 0.2 g of silica in a scintillation vial equipped with stir bar. Milli-Q water was added dropwise while constantly stirring until all particles were wet. The requisite amount of water was added and the pH was adjusted to 7. The mean particle size was 0.91 μm and the zeta potential at pH 7 was −47 mV.

Positive Silica Particles:

Alfa Aesar silicon dioxide powder (10.0 g) was dispersed in isopropanol (190.0 g) to make a 5 weight % dispersion by sonicating with a probe for ten minutes and then quickly placing it into a 4-neck 1-liter flask with an overhead stirrer and condenser. To the stirred dispersion was then added dimethylaminopropyl trimethoxysilane (d=0.978, 1.0 ml) followed by heating to 60° C. overnight in an oil bath. The reaction was allowed to cool over two hours. Excess 0.5 ml of iodomethane was then added to the solution followed by stirred at room temperature for two days. After filtration using a 4-8 μm porosity filter funnel, the filtrate was rinsed well with isopropyl alcohol. The treated particles were dried to afford 10.44 g of white particles. A 1 weight % dispersion of the particles was prepared with the requisite amount of water, and following a final sonication, was adjusted to pH 6. The mean particle size was 1.47 μm and the zeta potential at pH 6 was +49 mV.

Particle Size and Zeta Potential:

Particle size distributions were obtained using a Horiba LA-920 (Horiba Instruments Inc.) and a static light technique that produces a volume weighted distribution. Samples were analyzed while diluted in Ultrapure $H_2O$. Zeta potential was measured using the "Malvern Zetasizer Nano-ZS" (ZEN) from Malvern Instruments Ltd. Measured samples were diluted at the appropriate pH to a concentration level suitable for analysis.

Image Analysis:

Pattern areas and particle counts were determined from Tiff images of the samples obtained using an Olympus BX60 microscope, equipped with a Diagnostic, Inc. camera. The images were analyzed using ImageJ, a public domain, Java based image processing program developed at the National Institutes of Health, which program was downloaded from the nih.gov website. Version ImageJ 1.47p was used and the "analyze particles" function in ImageJ was utilized.

TABLE II

| Sample # | Article | Polymer | Step | Abs × 10³ [at 228 nm] | Abs × 10³ [at 260 nm] | % Retained Non-exposed [at 260 nm] After Neutralization | % Conversion [at 260 nm] After Exposure | % Retained [at 228 nm] After Exposure, Neutralization |
|---|---|---|---|---|---|---|---|---|
| 1 | Control | Comparative 1 | Non-exposed | 1.7 | 66.1 | — | — | — |
| 1 | Control | Comparative 1 | Non-exposed, neutralized | 1.7 | 60.3 | 91 | — | — |
| 2 | Control | Comparative 1 | Exposed | 43.7 | 0 | — | 100 | — |
| 3 | Control | Comparative 1 | Exposed, neutralized | 8.3 | 0.4 | — | — | 15 |
| 4 | Invention | Invention Example 12 | Non-exposed | 0.5 | 73.8 | — | — | — |
| 4 | Invention | Invention Example 12 | Non-exposed, neutralized | 1.1 | 61.5 | 83 | — | — |
| 5 | Invention | Invention Example 12 | Exposed | 46.7 | 0.2 | — | 100 | — |
| 6 | Invention | Invention Example 12 | Exposed, neutralized | 48.2 | 0.9 | — | — | 81 |
| 7 | Invention | Invention Example 1 | Non-exposed | 1.7 | 65.2 | — | — | — |
| 7 | Invention | Invention Example 1 | Non-exposed, neutralized | 3.1 | 59.1 | 91 | — | — |
| 8 | Invention | Invention Example 1 | Exposed | 41.6 | 0.1 | — | 100 | — |
| 9 | Invention | Invention Example 1 | Exposed, neutralized | 52.3 | 0.2 | — | — | 99 |
| 10 | Invention | Invention Example 6 | Non-exposed | 11.0 | 61.6 | — | — | — |
| 10 | Invention | Invention Example 6 | Non-exposed, neutralized | 11.3 | 58.3 | 95 | — | — |
| 11 | Invention | Invention Example 6 | Exposed | 38.4 | 0.1 | — | 100 | — |
| 12 | Invention | Invention Example 6 | Exposed, neutralized | 48.8 | 0.4 | — | — | 100 |
| 13 | Control | Comparative 2 | Non-exposed | 17.4 | 39.2 | — | — | — |
| 13 | Control | Comparative 2 | Non-exposed, neutralized | 18.1 | 34.1 | 87 | — | — |
| 14 | Control | Comparative 2 | Exposed | 23.2 | 0.3 | — | 99 | — |
| 15 | Control | Comparative 2 | Exposed, neutralized | 26.6 | 0.1 | — | — | 90 |

The data in TABLE II show that both the non-exposed and exposed regions of the polymeric layer were substantially retained followed the neutralization treatment with sodium bicarbonate. Further, it is apparent that at least 10 mol % of —B— (Gm) crosslinkable recurring units are desired in the reactive polymer to retain greater that 80% of the reactive polymer film on the substrate following exposure and neutralization. Experiments 13-15 demonstrate that it is desired that the reactive polymer comprise the -A- (TOSS) recurring units in an amount of greater than 50 mol % of the total recurring units to obtain desired ion exchange capacity. Thus, the reactive polymer of the present invention not only can serve as a thin film polymer resist but it can also be used as a patternable thin film ion exchanger material whose non-exposed regions remain as non-crosslinked with blocked aromatic sulfonic acid oxime ester groups and whose exposed regions are capable of use in ion exchange processes.

The % Conversion data shown in TABLE II were calculated at 260 nm as [1-(Neutralized/Initial)]×100. The % Retained data were calculated using the assumption that the 1.27 factor increase in Absorbance ("Abs") at 228 nm upon neutralization of the exposed 55/45 polymer (Invention Example 6) was due solely to the increased absorptivity of the neutralized sulfonate salt in the crosslinked polymer relative to the free sulfonic acid groups, and that this increased absorbance ratio was consistent for all ratios.

TABLE III

| Experiment | Polymer (TOSS nominal mol %) | Polymer Weight (g) | mmol of Acid | mmol of acid/g of polymer | Average mmol acid/g of polymer |
|---|---|---|---|---|---|
| 1 | 100 | 0.0030 | 0.0037 | 1.23 | 1.22 |
| 2 | 100 | 0.0030 | 0.0035 | 1.16 | |
| 3 | 100 | 0.0029 | 0.0037 | 1.27 | |
| 4 | 90 | 0.0031 | 0.0046 | 1.47 | 1.42 |
| 5 | 90 | 0.0034 | 0.0039 | 1.15 | |
| 6 | 90 | 0.0034 | 0.0055 | 1.63 | |
| 13 | 80 | 0.0032 | 0.0063 | 1.95 | 1.40 |
| 14 | 80 | 0.0033 | 0.0034 | 1.03 | |
| 15 | 80 | 0.0031 | 0.0044 | 1.43 | |
| 16 | 80 | 0.0033 | 0.0039 | 1.18 | |
| 7 | 50 | 0.0048 | 0.0031 | 0.65 | 0.66 |
| 8 | 50 | 0.0050 | 0.0028 | 0.56 | |
| 9 | 50 | 0.0048 | 0.0036 | 0.75 | |

TABLE III-continued

| Experiment | Polymer (TOSS nominal mol %) | Polymer Weight (g) | mmol of Acid | mmol of acid/g of polymer | Average mmol acid/g of polymer |
|---|---|---|---|---|---|
| 10 | 20 | 0.0041 | 0.0026 | 0.64 | 0.45 |
| 11 | 20 | 0.0040 | 0.0015 | 0.37 | |
| 12 | 20 | 0.0044 | 0.0015 | 0.35 | |

The data presented in TABLE III demonstrate that sufficient amount of TOSS monomer (-A- recurring units) can be present to obtain desired ion exchange capacity as defined herein.

TABLE IV

| Polymer | Polymer Condition | Polycationic Dye | Abs × $10^2$ at 528 nm |
|---|---|---|---|
| Comparative Example 1 | Non-exposed | A | 1.96 |
| Comparative Example 1" | Exposed and neutralized | A | 17.30 |
| Invention Example 12 | Non-exposed | A | 0.64 |
| Invention Example 12 | Exposed and neutralized | A | 28.40 |
| Invention Example 1 | Non-exposed | A | 0.47 |
| Invention Example 1 | Exposed and neutralized | A | 27.84 |
| Invention Example 6 | Non-exposed | A | 0.37 |
| Invention Example 6 | Exposed and neutralized | A | 16.56 |
| Comparative Example 2 | Non-exposed | A | 0.23 |
| Comparative Example 2 | Exposed and neutralized | A | 2.04 |

The data in TABLE IV demonstrate that the reactive polymers of the present invention effectively function in the described articles as thin film ion exchange materials to exchange cationic dye with the pendant sodium salt groups in the exposed regions of the polymeric layer. While the Comparative Example 1 polymer absorbed a considerable amount of the polycationic dye A in the exposed and neutralized regions of the polymeric layer, a considerable amount of the non-exposed polymer was readily washed off the substrate because it was not sufficiently crosslinked. Thus, it is important that the reactive polymer be able to both absorb the polycationic dye as well as be sufficiently de-blocked and crosslinked so it will remain adhered to the substrate during contact in aqueous-based solutions.

tion solution but not treated with a polycationic dye, no discrimination in particle adhesion was observed between the switched (exposed) and non-switched (non-exposed) polymers in the two different articles. The positively-charged silica particles remained adhered to both the switched and non-switched polymer layers. In contrast, the negatively-charged silica particles did not adhere to either the switched or non-switched polymer layers in these articles. Thus, it is clear that for the particular patterning method described herein, the reactive polymer must be used in combination with a polycationic dye that has a net positive charge greater than 2.

The data for Comparative Experiments 3-6 using an Inventive reactive polymer demonstrate the same lack of discrimination when a univalent cationic dye was used. Thus, the reactive polymers should be both de-blocked and crosslinked and used with a polycationic dye to provide desired discrimination.

The data for Invention Experiments 7-15 demonstrate that following treatment with a polycationic dye, there was complete discrimination between the switched and non-switched polymeric layer formed using a reactive polymer of the present invention. That is, the negatively-charged silica particles adhered well to the dye-treated non-switched polymeric layer (containing reactive polymer) and were completely rejected by the dye-treated switched polymeric layer (containing crosslinked polymer derived from the reactive polymer of the present invention). The converse behavior was observed with use of the positively-charged silica particles.

Without being bound by any particular mechanistic explanation, it is believed that in the switched regions of the polymeric layer, the absorbed polycationic dye was insufficient to neutralize the large number of pendant sulfonate groups and the reactive polymer surface remained anionic. However, in the non-switched regions, without pendant sulfonate groups, the adsorbed polycationic dye rendered the polymeric layer

TABLE V

| Experiment | Polymer | UV Switch (Exposure?) | Cationic Dye | Cationic Dye Charge | Number of (−) Silica Particles per 100 $\mu m^2$ | Number of (+) Silica Particles per 100 $\mu m^2$ |
|---|---|---|---|---|---|---|
| 1 | Invention Example 1 | No | None | − | 0 | 14 |
| 2 | Invention Example 1 | Yes | None | − | 0 | 9 |
| 3 | Invention Example 1 | No | F | +1 | 4 | 19 |
| 4 | Invention Example 1 | Yes | F | +1 | 0 | 19 |
| 5 | Invention Example 1 | No | G | +1 | 0 | 26 |
| 6 | Invention Example 1 | Yes | G | +1 | 0 | 25 |
| 7 | Invention Example 1 | No | A | +5 | 55 | 0 |
| 8 | Invention Example 1 | Yes | A | +5 | 0 | 12 |
| 9 | Invention Example 1 | No | B | +3 | 42 | 0 |
| 10 | Invention Example 1 | Yes | B | +3 | 0 | 18 |
| 11 | Invention Example 1 | No | C | +3 | 53 | 0 |
| 12 | Invention Example 1 | Yes | C | +3 | 0 | 21 |
| 13 | Invention Example 1 | No | D | +4 | 51 | 0 |
| 14 | Invention Example 1 | Yes | D | +4 | 0 | 17 |
| 15 | Invention Example 1 | No | E | +4 | 61 | 0 |
| 16 | Invention Example 1 | Yes | E | +4 | 0 | 19 |

The data in TABLE V indicate that for the separate articles of Control Experiments 1 and 2 using a reactive polymer of this invention, both having been treated with the neutralizasurface cationic. The use of the polycationic dye therefore rendered the polymeric layer comprising the reactive polymer of this invention as patternable.

TABLE VI

| Experiment | Polymer | UV Switch (Exposed?) | Polycationic Dye | Charge on Dye | Number of (−) Silica Particles per 100 μm² | Number of (−) Silica Particles per 100 μm² |
|---|---|---|---|---|---|---|
| 1 | Comparative Example 1 | No | A | +5 | 54 | |
| 2 | Comparative Example 1 | Yes | A | +5 | 0 | |
| 3 | Invention Example 12 | No | A | +5 | 52 | |
| 4 | Invention Example 12" | Yes | A | +5 | 0 | |
| 5 | Invention Example 1 | No | A | +5 | 48 | |
| 6 | Invention Example 1 | Yes | A | +5 | 0 | |
| 7 | Invention Example 6 | No | A | +5 | 47 | |
| 8 | Invention Example 6 | Yes | A | +5 | 0 | |
| 9 | Comparative Example 2 | No | A | +5 | 27 | |
| 10 | Comparative Example 2 | Yes | A | +5 | 0 | |

The data in TABLE VI demonstrate that when using a cationic dye in the patterning process, adequate selectivity is best with an optimal molar ratio of the -A- and —B— recurring units in the reactive polymer as the polymer coatings obtained from Comparative Example polymers did not show the desired selectivity.

The following cationic dyes were tested in the experiments described above. Dyes A through E are polycationic dyes that are useful in the patterning methods described above while Dyes F and G are univalent cationic dyes that are not useful in this manner.

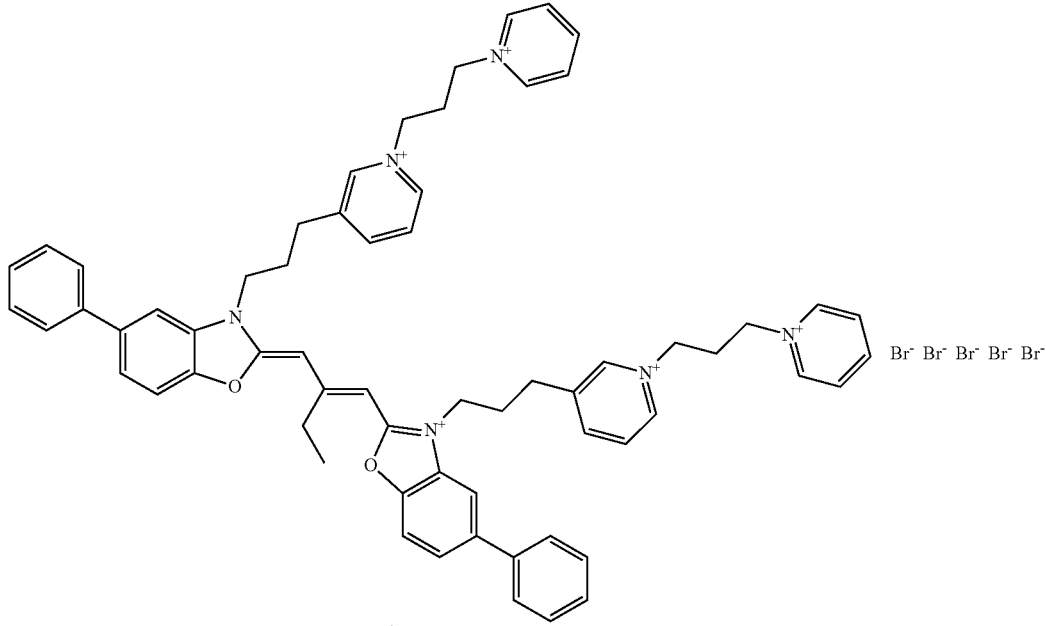

Dye A

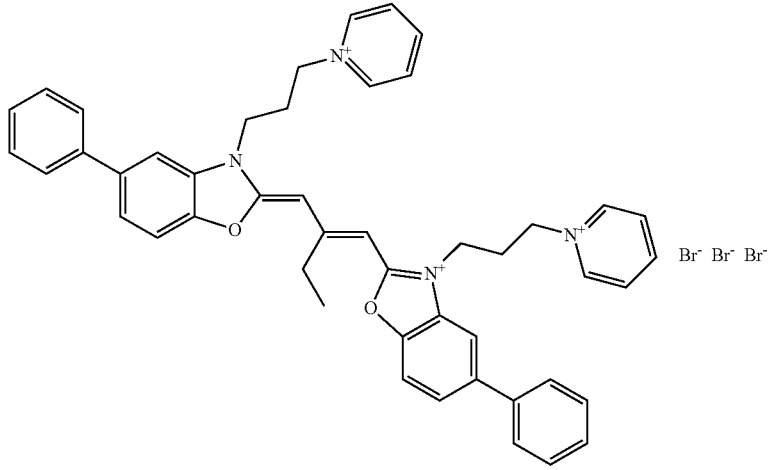

Dye B

-continued

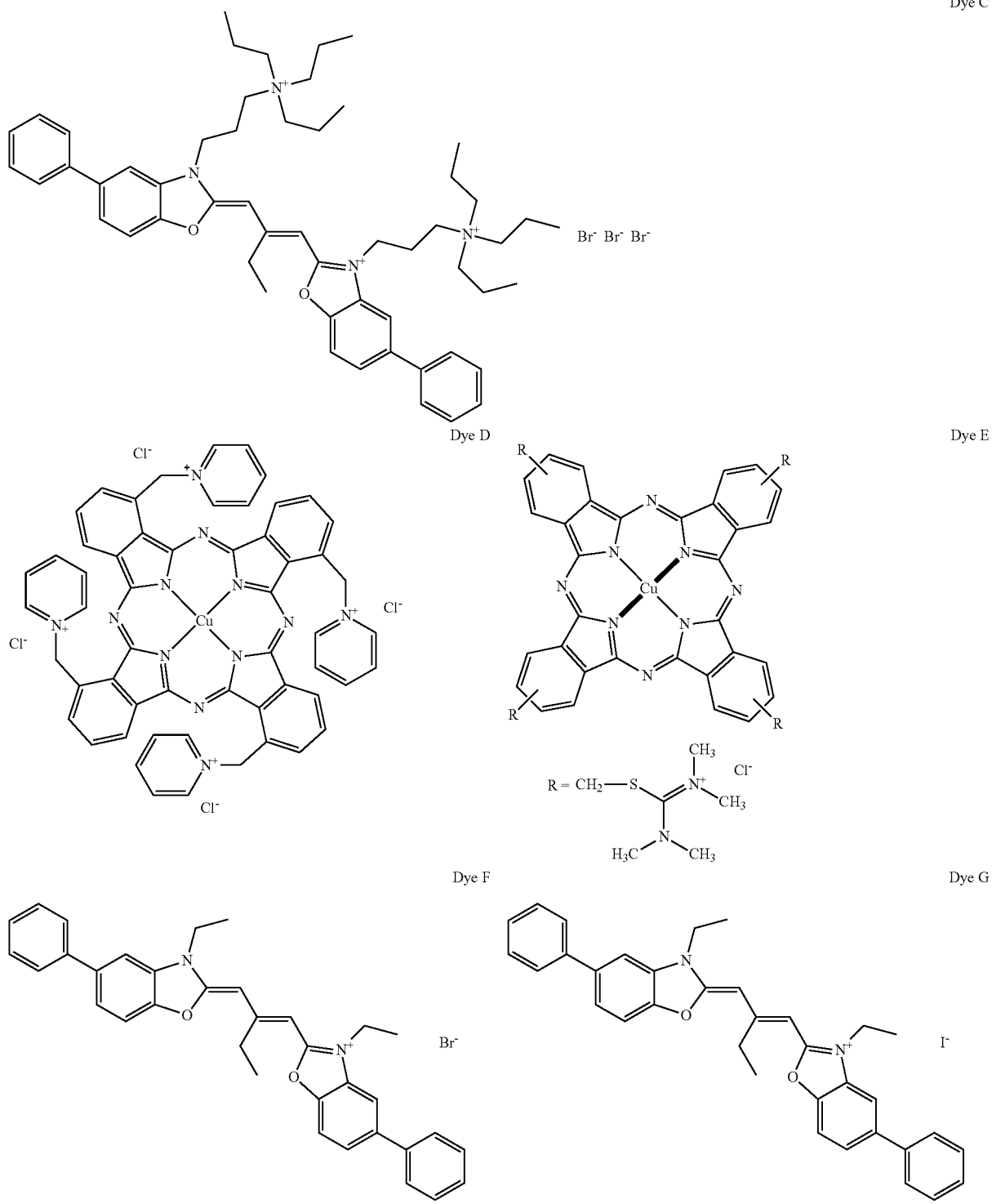

The invention has been described in detail with particular reference to certain preferred embodiments thereof, but it will be understood that variations and modifications can be effected within the spirit and scope of the invention.

The invention claimed is:

1. A precursor article comprising a substrate having thereon a dry coating of a reactive polymer, the reactive polymer comprising a backbone and at least -A- and —B— recurring units, arranged randomly along the backbone, wherein:
the -A- recurring units comprise pendant aromatic sulfonic acid oxime ester groups that are capable of providing pendant aromatic sulfonic acid groups upon irradiation with radiation having a $\lambda_{max}$ of at least 150 nm and up to and including 450 nm, the -A-recurring units being present in the reactive polymer in an amount of greater than 50 mol % and up to and including 98 mol % based on total reactive polymer recurring units, and the —B— recurring units comprise pendant groups that can provide crosslinking upon generation of the pendant aromatic sulfonic acid groups in the -A- recurring units, the —B— recurring units being present in an amount of at least 2 mol %, based on total reactive polymer recurring units.

2. The precursor article of claim 1, wherein the dry coating of the reactive polymer has an average dry thickness of at least 10 nm.

3. The precursor article of claim 1, wherein the -A- recurring units are present in the reactive polymer in an amount of at least 60 mol % and up to and including 95 mol % based on total reactive polymer recurring units, or the —B— recurring units are present in the reactive polymer an amount of at least 5 mol % and up to and including 40 mol % based on total reactive polymer recurring wilts.

4. The precursor article of claim 1, wherein the —B— recurring units in the reactive polymer comprise pendant crosslinking epoxy groups.

5. The precursor article of claim 1, wherein the reactive polymer further comprises one or more additional recurring units that are different from all -A- and —B— recurring units, and are derived from one or more ethylenically unsaturated polymerizable monomers selected from the group consisting of alkyl acrylates, alkyl methacrylates, (meth)acrylamides, vinyl esters, (meth)acrylonitrile, maleic anhydrides, maleic imides, and styrene and styrene derivatives.

6. The precursor article of claim 1, wherein the reactive polymer is capable upon irradiation to have an ion exchange capacity of at least 20% based on the theoretical ion exchange capacity of an irradiated homopolymer having only the same -A-recurring units.

7. The precursor article of claim 1, wherein the -A- recurring units in the reactive polymer are derived from 1,2,3,4-tetrahydro-1-naphthylideneamino-p-styrenesulfonate that are present in an amount of greater than 60 mol % and up to and including 95 mol %, based on total reactive polymer recurring units, and the —B— recurring units in the reactive polymer comprise pendant epoxy groups that are present in an amount of at least 5 mol % and up to and including 40 mol %, based on total reactive polymer recurring units.

8. An intermediate article comprising a substrate having thereon a dry coating comprising:
(1) exposed regions comprising a de-blocked, crosslinked, and neutralized polymer comprising a backbone and at least reacted -A- and reacted —B— recurring units, arranged randomly along the backbone, wherein:
the reacted -A- recurring units comprise pendant aromatic sulfonic acid salt groups, the reacted -A- recurring units being present in the reactive polymer in an amount of greater than 50 mol % and up to and including 98 mol % based on total reactive polymer recurring units, and
the reacted —B— recurring units provide crosslinking of the reactive polymer, the reacted —B— recurring units being present in an amount of at least 2 mol %, based on total reactive polymer recurring units, and
(2) optionally, non-exposed regions comprising a reactive polymer comprising a backbone and at least -A- and —B— recurring units, arranged randomly along the backbone, wherein:
the -A- recurring units comprise pendant aromatic sulfonic acid oxime ester groups that are capable of providing pendant aromatic sulfonic acid groups upon irradiation with radiation having a $\lambda_{max}$ of at least 150 nm and up to and including 450 nm, the -A-recurring units being present in the reactive polymer in an amount of greater than 50 mol % and up to and including 98 mol % based on total reactive polymer recurring units, and the —B— recurring units comprise pendant groups that can provide crosslinking upon generation of the pendant aromatic sulfonic acid groups in the -A- recurring units, the —B— recurring units being present in an amount of at least 2 mol %, based on total reactive polymer recurring units.

9. The intermediate article of claim 8, wherein the -A-recurring units of the neutralized polymer comprise pendant aromatic sulfonic acid alkali metal salt groups.

10. The intermediate article of claim 8, wherein the reactive polymer further comprises one or more additional recurring units that are different from all -A- and —B— recurring units, and are derived from one or more ethylenically unsaturated polymerizable monomers selected from the group consisting of alkyl acrylates, alkyl methacrylates, (meth)acrylamides, vinyl esters, (meth)acrylonitrile, maleic anhydrides, maleic imides, and styrene and styrene derivatives.

11. The intermediate article of claim 8, wherein the -A-recurring units in the reactive polymer are derived from 1,2,3,4-tetrahydro-1-naphthylideneamino-p-styrenesulfonate that are present in an amount of greater than 60 mol % and up to and including 95 mol %, based on total reactive polymer recurring units, and the —B— recurring units in the reactive polymer comprise pendant epoxy groups that are present in an amount of at least 5 mol % and up to and including 40 mol %, based on total reactive polymer recurring units.

12. A crosslinked polymeric film comprising a de-blocked, crosslinked, and neutralized polymer comprising a backbone and at least reacted -A- and reacted —B— recurring units, arranged randomly along the backbone,
wherein:
the reacted -A- recurring units comprise pendant aromatic sulfonic acid salt groups, the reacted -A- recurring units being present in an amount of greater than 50 mol % and up to and including 98 mol % based on total polymer recurring units, and
the reacted —B— recurring units provide crosslinking of the polymer, the —B— recurring units being present in an amount of at least 2 mol %, based on total polymer recurring units.

13. The crosslinked polymeric film of claim 12, having a dry thickness of at least 10 nm.

14. The crosslinked polymeric film of claim 12, wherein the reactive polymer further comprises one or more additional recurring units that are different from all -A- and —B— recurring units, and are derived from one or more ethylenically unsaturated polymerizable monomers selected from the group consisting of alkyl acrylates, alkyl methacrylates, (meth)acrylamides, vinyl esters, (meth)acrylonitrile, maleic anhydrides, maleic imides, and styrene and styrene derivatives.

15. The crosslinked polymeric film of claim 12, wherein the -A-recurring units in the reactive polymer are derived from 1,2,3,4-tetrahydro-1-naphthylideneamino-p-styrenesulfonate that are present in an amount of greater than 60 mol % and up to and including 95 mol %, based on total reactive polymer recurring units, and the —B— recurring units in the reactive polymer comprise pendant epoxy groups that are present in an amount of at least 5 mol % and up to and including 40 mol %, based on total reactive polymer recurring units.

16. An article comprising a substrate, and having thereon a dry polymeric coating comprising exposed and optional non-exposed regions, wherein:

the exposed regions comprise a de-blocked, crosslinked, and neutralized polymer comprising a backbone and recurring units comprising neutralized pendant aromatic sulfonic acid groups, and crosslinks derived from different recurring units, the recurring units comprising neutralized pendant aromatic sulfonic acid groups are derived from -A- recurring units and the different recurring units are derived from —B— recurring units, the -A- recurring units comprise pendant aromatic sulfonic acid oxime ester groups, which recurring units are capable of providing neutralized pendant aromatic sulfonic acid groups upon irradiation with radiation having a $\lambda_{max}$ of at least 150 nm and up to and including 450 nm, and the —B— recurring units comprise pendant groups that can provide crosslinking upon generation of the pendant aromatic sulfonic acid groups in the -A- recurring units, and the optional non-exposed regions comprise a reactive polymer comprising -A-recurring units in an amount greater than 50 mol % and up to and including 98 mol % based on total reactive polymer recurring units, and —B— recurring units in an amount of at least 2 mol % based on total reactive polymer recurring units.

17. The article of claim 16, wherein the reactive polymer further comprises one or more additional recurring units that are different from all -A- and —B— recurring units, and are derived from one or more ethylenically unsaturated polymerizable monomers selected from the group consisting of alkyl acrylates, alkyl methacrylates, (meth)acrylamides, vinyl esters, (meth)acrylonitrile, maleic anhydrides, maleic imides, and styrene and styrene derivatives.

18. The article of claim 16, wherein the -A- recurring units in the reactive polymer are derived from 1,2,3,4-tetrahydro-1-naphthylideneamino-p-styrenesulfonate that are present in an amount of greater than 60 mol % and up to and including 95 mol %, based on total reactive polymer recurring units, and the —B— recurring units in the reactive polymer comprise pendant epoxy groups that are present in an amount of at least 5 mol % and up to and including 40 mol %, based on total reactive polymer recurring units.

* * * * *